United States Patent [19]

Negami et al.

[11] Patent Number: 5,728,231
[45] Date of Patent: Mar. 17, 1998

[54] PRECURSOR FOR SEMICONDUCTOR THIN FILMS AND METHOD FOR PRODUCING SEMICONDUCTOR THIN FILMS

[75] Inventors: Takayuki Negami; Masaharu Terauchi, both of Osaka; Mikihiko Nishitani, Nara; Takahiro Wada, Osaka, all of Japan

[73] Assignee: Matsushita Electric Industrial Co., Ltd., Osaka, Japan

[21] Appl. No.: 648,497

[22] Filed: May 15, 1996

[30] Foreign Application Priority Data

May 15, 1995 [JP] Japan .................................. 7-116164
Jun. 8, 1995 [JP] Japan .................................. 7-141999

[51] Int. Cl.$^6$ ................................................ H01L 31/18
[52] U.S. Cl. .................... 148/33; 148/33.3; 136/264; 136/262; 136/265; 427/74; 427/76; 437/5; 437/141; 437/143; 437/144; 437/154; 428/620; 428/632; 428/642; 428/674
[58] Field of Search ................ 148/33, 33.3; 428/620, 428/632, 642, 674; 437/5, 108–109, 111, 141–144, 153–154; 427/74, 76; 136/264–265, 262

[56] References Cited

U.S. PATENT DOCUMENTS

| | | | |
|---|---|---|---|
| 5,389,572 | 2/1995 | Negami et al. | 437/141 |
| 5,422,304 | 6/1995 | Kohiki et al. | 437/105 |
| 5,445,847 | 8/1995 | Wada et al. | 427/74 |
| 5,474,622 | 12/1995 | Negami et al. | 136/265 |
| 5,506,426 | 4/1996 | Kohiki et al. | 257/188 |
| 5,567,469 | 10/1996 | Wada et al. | 427/74 |

OTHER PUBLICATIONS

M. Marudachalam et al, *1st WCPEC*, Hawaii, Dec. 1994, pp. 234–237.

H. Marudachalam et al, *Appl. Phys. Lett.*, vol. 67, Dec. 1995, pp.3978–3980.

Wada, et al., "Preparation of CuInS$_2$ films by sulfurization of Cu–In–O films", *Appl. Phys. Lett.* 62 (16), Apr. 1993, pp. 1943–1945.

Bodegard, et al., "The Influence of Sodium on the Grain Structure of CuInSe$_2$ Films for Photovoltaic Applications", 12th European Photovoltaic Solar Energy Conference, Apr. 1994, Amsterdam, The Netherlands, pp. 1743–1746.

Ruckh, et al., "Influence of Substrates on the Electrical Properties of Cu(In,Ga)Se$_2$ Thin Films", First WCPEC, Dec. 1994, Hawaii, USA, pp.156–159.

*Primary Examiner*—Aaron Weisstuch
*Attorney, Agent, or Firm*—Merchant, Gould, Smith, Edell, Welter & Schmidt, P.A.

[57] ABSTRACT

A precursor for manufacturing a semiconductor thin film in which an oxide thin film comprising at least one element as a dopant, selected from a group which consists of Groups IA, IIA, IIB, VA, and VB elements, and Groups IB and IIIA elements which are main components of the semiconductor thin film are deposited on a substrate, or a precursor for manufacturing a semiconductor thin film which is formed by depositing a thin film of oxide comprising the Groups IB and IIIA elements on the substrate wherein the content of at least one of the Groups IB and IIIA elements is varied in the direction of film thickness, and a method for manufacturing a semiconductor thin film comprising the step of heat treating the precursor for manufacturing the semiconductor thin film in an atmosphere containing a Group VIA element. The present invention provides a precursor for manufacturing a semiconductor thin film and a method for manufacturing the semiconductor thin film using the precursor which are suitable for manufacturing a semiconductor thin film having a chalcopyrite structure that has a high and uniform energy conversion efficiency when the semiconductor thin film is used as a photoabsorptive layer of a solar cell.

39 Claims, 15 Drawing Sheets

PRECURSOR FOR SEMICONDUCTOR THIN FILMS AND METHOD FOR PRODUCING SEMICONDUCTOR THIN FILMS

BACKGROUND OF THE INVENTION

1. Field of the Invention

This invention relates to a precursor for forming semiconductor thin films and a method for manufacturing semiconductor thin films using the precursor, and more particularly to a precursor for forming semiconductor thin films and a method for manufacturing semiconductor thin films suitable for a solar cell having a high energy conversion efficiency.

2. Description of the Prior Art

A thin film solar cell using, for a photoabsorptive layer, a compound semiconductor thin film (a semiconductor thin film having a chalcopyrite structure) that comprises Groups IB, IIIA, and VIA elements such as $CuInSe_2$ has high energy conversion efficiency and does not suffer from efficiency deterioration due to light irradiation or the like. A selenization method has been disclosed as a method for manufacturing a comparatively uniform $CuInSe_2$ thin film to fabricate a large area solar cell to be used as an energy source. According to the selenization method, a laminated thin film of Cu and In formed on a metallic film is sintered in an atmosphere containing $H_2Se$ and Se vapor so that the large area solar cell is fabricated. In addition, the selenization method comprises simple steps and can reduce the manufacturing cost of the $CuInSe_2$ thin film. However, a variation in composition ratio occurs in micro areas due to aggregation of In, and the conversion efficiency is deteriorated by the formation of impurity phase compounds other than $CuInSe_2$. As a method for solving these problems, we have disclosed a method for forming an oxide (Cu-In-O) thin film containing Cu and In and sintering the oxide thin film in an atmosphere containing $H_2S$ gas to form a $CuInS_2$ film in "Preparation of $CuInS_2$ films by sulfurization of Cu-In-O films," published in "Applied Physics Letters" Vol. 62, No. 16, pages 1943 to 1945. Although our report has described that a $CuInS_2$ film is formed, however, a $CuInSe_2$ film can also be formed by using an $H_2Se$ gas. This method uses an oxide of Cu and In. Hence, $CuInS_2$ films and $CuInSe_2$ films that have large areas and uniform compositions are obtained without In aggregation. These films have such a carrier concentration as to be applied to the photoabsorptive layers of the solar cell. In order to implement a solar cell having a higher conversion efficiency, it is necessary to control the carrier concentration.

It has been reported that the carrier concentration and quality of the $CuInSe_2$ film are influenced by a Group IA element such as Na contained in a soda lime glass used as a substrate. In the 12th E.C. Photovoltaic Solar Energy Conference held on Apr. 11–15, 1994 in Amsterdam, M. Bodegard et al. presented a paper having the title of "The Influence of Sodium on the Grain Structure of $CuInSe_2$ Films for Photovoltaic Applications" in which Na contained in the soda lime glass is diffused into the $CuInS_2$ film and particles of Na grow. In addition, they disclosed that a solar cell using the $CuInSe_2$ film in which Na is diffused has a higher energy conversion efficiency. In the 1st World Conference on Photovoltaic Energy Conversion held on Dec. 5–9, 1994 in Waikoloa, Hawaii, M. Ruckh et al. presented a paper having the title of "Influence of Substrates on the Electrical Properties of Cu(In,Ga)Se_2 Thin Films," in which a $Cu(In,Ga)Se_2$ film (hereinafter referred to as a CIGS film) deposited on a glass containing Na has a small resistance value, the conversion efficiency of a solar cell which is fabricated by depositing an $Na_2O_2$ film on a substrate and then forming CIGS film is increased by about 2% over that of a solar cell in which the $Na_2O_2$ film is not deposited, and the conversion efficiency becomes constant irrespective of the Cu/In ratio. They have described that the above effects can be obtained because the carrier concentration of the CIGS film is increased by the addition of Na and the diode rectification characteristics are improved. As is apparent from the above reports, it is effective that Na is diffused or added in order to promote the growth of the $CuInSe_2$ film, increase the carrier concentration, and enhance the efficiency of the solar cell.

As a method for doping the $CuInSe_2$ film by the vapor deposition method disclosed in U.S. Pat. No. 5,422,304, Se, which is a Group VIA element, is substituted for N or P, which is a Group VA element. This method is effective in controlling the carrier concentration of a p type $CuInSe_2$ film.

Apart from the foregoing, it is important that a pn homo-junction in which an interface layer that is not exposed to the air is formed so as to increase the efficiency of the solar cell and make it uniform. For this technology, it is necessary to control the conductivity type. A method for doping a Group IIB element such as Zn or Cd has been known as a method for making an n-type semiconductor having a chalcopyrite structure including Groups IB, IIIA, and VIA elements. As disclosed in U.S. Pat. No. 5,389,572, it is known that Se, which is the Group VIA element, is substituted for Cl, which is a Group VIIA element, when using the vapor deposition method.

An example of a parameter for determining the performance of the solar cell is carrier concentration. If the carrier concentration is high, the diffusion potential of the pn junction becomes high, whereby the open circuit voltage (Voc) is increased. However, the width of the depletion layer whose carriers can be collected with little recombination thereof is reduced. Consequently, the short-circuit photocurrent is decreased. If the carrier concentration is low, the depletion layer width is increased. Consequently, the short circuit photocurrent is increased. However, since the diffusion potential is lowered, the open circuit voltage is reduced. Accordingly, there is a carrier concentration which is necessary for converting light to electrical energy most effectively. Furthermore, when the carrier concentration varies over the thickness of the film, an internal electric field is generated within the film. Consequently, the recombination probability of carriers is decreased in areas other than the depletion layer area and the current is increased. Thus, a solar cell having a high conversion efficiency can be obtained by controlling the carrier concentration and distribution. However, the semiconductor thin film having a chalcopyrite structure which is produced by the method for selenization of metallic thin films has a carrier concentration suitable for the formation of the solar cell. Therefore, a step of controlling the carrier concentration is not included. In the case where a soda lime glass containing Na is used as a substrate, the temperature is increased during selenization so that Na of the substrate is automatically diffused to dope the semiconductor thin film. However, the carrier concentration and distribution is not always the most suitable for the solar cell. Furthermore, it is necessary to fabricate an n type window layer such as CdS or ZnO in a separate step in order to form a pn junction in a $CuInSe_2$ type solar cell. The chemical deposition method using a solution is mainly adopted for the formation of the window layer. Thus, inevitably a p type $CuInSe_2$ film as an absorber layer is exposed to the air. In some cases, an oxidation layer is formed or impurities adhere. The oxidation or impurity layer causes an increase in carrier recombination centers or the formation of an energy barrier so that the conversion efficiency of the solar cell is reduced. Accordingly, if a pn homo-junction can be formed in a $CuInSe_2$ type film, the quality of the pn junction interface, which greatly influences the performance of the solar cell, can be enhanced. Consequently, the conversion efficiency can be enhanced or made uniform.

An example of the most effective method for controlling conductivity type, carrier concentration, or carrier distribution is the ion implantation method. However, it is difficult to dope a large area film uniformly in a short time. Furthermore, the film may be damaged by ion implantation. The damaged portion becomes a recombination center of the carriers so that the efficiency of the solar cell is reduced. Heat annealing is required in order to eliminate the damaged portions. However, since the number of manufacturing steps is increased, there are possibilities of disadvantageous influences such as deterioration of the uniformity of the quality, cost increase, and change in quality of the films at a high temperature. As another method, diffusion is performed by heat treatment in a dopant atmosphere after film formation or by heat treatment after a solid dopant is deposited on the film. Also in this method, defects are caused by an increase in the number of manufacturing steps and the quality of films is changed by heat treatment. Accordingly, it is difficult to industrially and effectively provide a chalcopyrite structure type semiconductor thin film that comprises Groups IB, IIIA, and VIA elements in which the carrier concentration is controlled by a dopant, and more preferably, the distribution of the carrier concentration in the direction of film thickness is controlled as intended.

In the thin film solar cell using $CuInSe_2$ for an absorber layer, which is a semiconductor thin film having a chalcopyrite structure that comprises Groups IB, IIIA, and VIA elements, the band gap energy is about 1.0 eV, which is smaller than the band gap energy of an absorber layer having the highest conversion efficiency obtained by matching with the sunlight spectrum, i.e., about 1.4 eV. A solar cell using a $Cu(In,Ga)Se_2$ thin film having a band gap energy increased by forming a solid solution with Ga (a Group IIIA element) has been actively developed. As a method for enhancing the efficiency of the solar cell, the band gap of the absorber layer is gradually changed. If the band gap is changed, an electric field is generated in the absorber layer so that the photo-excited carriers can be collected efficiently. Accordingly, the photocurrent is increased. In order to change the band gap gradually, a graded type $Cu(In,Ga)Se_2$ film has been studied. In the graded type $Cu(In,Ga)Se_2$ film, the composition ratio of Ga is varied in the direction of film thickness of the absorber layer. Referring to the graded type $Cu(In,Ga)Se_2$ film according to the prior art, metallic elements Cu, In, and Ga are mixed or stacked with the desired composition. However, it is hard to control the diffusion speed in the metallic state. Consequently, the desired composition is hard to obtain so that a layer having a composition ratio which changes in the thickness direction cannot be obtained with a desired composition ratio. In addition, the composition ratio is hard to control in the case of mass production. Consequently, constant quality cannot be obtained.

According to the method disclosed by the present inventors in the above-mentioned publication "Applied Physics Letters," Vol. 62, No. 16, pages 1943 to 1945, an oxide of Cu and In is used so that $CuInS_2$ and $CuInSe_2$ films having large areas and uniform compositions are obtained without segregation and phase separation of In.

A semiconductor thin film having a chalcopyrite structure, which is fabricated by heat treating an oxide thin film in a chalcogen atmosphere, for example, with $H_2S$, $H_2Se$, and the like, has a uniform composition ratio and resists generation of an impurity phase product. In the above publication, however, an attempt to control the band gap in order to increase the efficiency has not been disclosed. A method for changing the band gap, for example, with the graded type $Cu(In,Ga)Se_2$ film, has not been disclosed. In order to further increase the efficiency of the solar cell having a large area and uniform conversion efficiency, it is necessary to intentionally change the band gap of the semiconductor thin film having a chalcopyrite structure, which is reduced by the sulfurization or selenization method in which an oxide thin film acts as a precursor.

The $CuInS_2$ and $CuInSe_2$ films which are made from Cu-In-O as a precursor by the sulfurization or selenization method have a small adhesion to a metallic film on the surface that is used as an electrode. Accordingly, it is preferred that the adhesion is increased to fabricate a solar cell having a stable conversion efficiency.

SUMMARY OF THE INVENTION

It is a general object of the present invention to provide a precursor for manufacturing a semiconductor thin film that is suitable for enhancing the conversion efficiency of a solar cell when it is used as a semiconductor thin film for the absorber layer of the solar cell, and a method for manufacturing a semiconductor thin film using the precursor.

It is another object of the present invention to provide a precursor for manufacturing a semiconductor thin film having a chalcopyrite structure in which the amount and distribution of an element as a dopant are controlled and it is possible to obtain a carrier concentration suitable for enhancing the conversion efficiency of a solar cell when the precursor is used as a semiconductor thin film for an absorber layer of the solar cell, and a method for manufacturing the semiconductor thin film having a chalcopyrite structure using the precursor.

It is still another object of the present invention to provide a precursor suitable for manufacturing a semiconductor thin film having a chalcopyrite structure that can control a composition ratio as intended, and has a variation of the band gap suitable for a solar cell having a large area and a uniform conversion efficiency, and a method for manufacturing the semiconductor thin film having a chalcopyrite structure which is made from the precursor and is useful to obtain a solar cell having an excellent productivity and a high energy conversion efficiency.

The present invention provides a first precursor for manufacturing a semiconductor thin film, said precursor comprising an oxide thin film comprising at least one element as a dopant, selected from a group which consists of Groups IA, IIA, IIB, VA, and VB elements, and Groups IB and IIIA elements as main components of the semiconductor thin film are deposited on a substrate.

In the first precursor for manufacturing a semiconductor thin film, it is preferred that the oxide thin film comprising the dopant element and Groups IB and IIIA elements deposited on the substrate have a composition ratio with respect to the dopant which is not constant from the substrate to the film surface in the direction of film thickness.

The present invention provides a second precursor for manufacturing a semiconductor thin film in which at least two oxide thin films each comprising an element as a dopant and Groups IB and IIIA elements are deposited on a substrate, the oxide thin films having two or more layers in which the composition ratios of the dopant element are different.

The present invention provides a third precursor for manufacturing a semiconductor thin film, wherein at least one oxide thin film comprising Groups IB and IIIA elements and at least one oxide thin film comprising an element as a dopant are alternately deposited on a substrate.

In the third precursor for manufacturing a semiconductor thin film, it is preferred that an oxide thin film comprising the dopant element is deposited on the substrate and an oxide thin film comprising Groups IB and IIIA elements is then deposited. In particular, if the dopant element is a Group IA, VA, or VB element and the substrate is a metal body or metal film, or if the dopant element is a Group IIA or IIB element and the substrate is a transparent conductive film, the above embodiment is preferred.

In the third precursor for manufacturing a semiconductor thin film, it is preferred that an oxide thin film comprising Groups IB and IIIA elements is deposited on the substrate and an oxide thin film comprising an element as a dopant is then deposited. In particular, if the dopant element is a Group IA, VA, or VB element and the substrate comprises a transparent conductive film, the above embodiment is preferred. Also, if the dopant element is a Group IIA or IIB element and the substrate is a metal body or metal film, the present embodiment is preferred.

In the third precursor for manufacturing a semiconductor thin film, it is preferred that an oxide thin film comprising a first element as a dopant, an oxide thin film comprising Groups IB and IIIA elements, and an oxide thin film comprising a second element as a dopant are sequentially deposited. In this case, oxide thin films comprising two kinds of dopants that supply holes and electrons are used. The present embodiment is effective for forming a pn homo-junction.

In the above embodiment in which two kinds of dopants are used, it is preferred that the substrate is a metal or a metal film, the first element which acts as a dopant is at least one element selected from the group which consists of Groups IA, VA, and VB elements, and the second element which acts as a dopant is at least one element selected from the group which consists of Groups IIA and IIB elements.

Similarly, in the embodiment in which two kinds of dopants are used, it is preferred that the substrate is a transparent conductive film or a two-layered film comprising a transparent conductive film and a transparent insulating film, the first element which acts as a dopant is at least one element selected from the group which consists of Groups IIA and IIB elements, and the second element which acts as a dopant is at least one element selected from the group which consists of Groups IA, VA, and VB elements.

A method for manufacturing a semiconductor thin film comprises the step of heat treating the precursor for manufacturing a semiconductor thin film described above in an atmosphere containing a Group VIA element.

According to the method for manufacturing a semiconductor thin film, it is preferred that the atmosphere containing the Group VIA element comprises at least one compound selected from a group which consists of hydride gas of the Group VIA element, a carbon compound of the Group VIA element, and an organic compound of the Group VIA element.

According to the method for manufacturing a semiconductor thin film using a dopant, it is preferred that the heat treatment is performed in an atmosphere further containing at least one of hydrogen and carbon monoxide.

According to the method for manufacturing a semiconductor thin film using a dopant, it is preferred that the heat treatment is performed at a temperature of 200° to 1000° C.

According to the method for manufacturing a semiconductor thin film using a dopant, it is preferred that the semiconductor thin film is used as an absorber layer of the solar cell.

The present invention provides a precursor for manufacturing a semiconductor thin film in which the variation of the band gap is controlled, and a method of manufacturing a semiconductor thin film.

In another aspect, the present invention provides a precursor for manufacturing a semiconductor thin film in which an oxide thin film comprising Groups IB and IIIA elements is deposited on a substrate, wherein the composition of at least one of the Groups IB and IIIA elements is varied in the direction of film thickness.

As a method for forming the oxide thin film which acts as a precursor for manufacturing a semiconductor thin film according to this aspect of the present invention, there are three embodiments.

According to a first embodiment of the present invention, the oxide thin film comprising the Groups IB and IIIA elements deposited on the substrate contains a Group IB element and at least two kinds of Group IIIA elements, and the composition ratio of the Group IIIA elements is continuously varied from the substrate to the deposited oxide thin film surface in the direction of film thickness.

According to a second embodiment of the present invention, the oxide thin film comprising the Groups IB and IIIA elements deposited on the substrate has two or more layers which contain a Group IB element and at least one Group IIIA element respectively, and the oxide thin film having two or more layers has different composition ratios of a specific Group IIIA element.

According to a third embodiment of the present invention, the oxide thin film comprising Groups IB and IIIA elements deposited on the substrate has two or more layers in which the Group IIIA element is different.

In the precursor for manufacturing a semiconductor thin film described above, it is preferred that the Group IIIA element of the oxide thin film comprising the Groups IB and IIIA elements that is in contact with the substrate side includes at least Ga.

In the precursor for manufacturing a semiconductor thin film described above, it is preferred that the substrate is a metal substrate or an insulating substrate coated with a metal thin film.

In the precursor for manufacturing a semiconductor thin film described above, it is preferred that the substrate is a transparent insulating substrate coated with a transparent conductive film or a transparent insulating substrate coated with a transparent conductive film and a transparent insulating film.

The present invention provides a method for manufacturing a semiconductor thin film, comprising the step of heat treating the precursor for manufacturing a semiconductor thin film in an atmosphere containing a Group VIA element so that a semiconductor thin film having a chalcopyrite structure which comprises the Groups IB, IIIA, VIA elements is formed.

According to the method for manufacturing a semiconductor thin film, it is preferred that the heat treatment is performed in an atmosphere further containing at least one of hydrogen and carbon monoxide.

According to the method for manufacturing a semiconductor thin film described above, it is preferred that the heat treatment is performed at a temperature of 200° to 1000° C.

According to the method for manufacturing a semiconductor thin film described above, it is preferred that the semiconductor thin film is used as an absorber of a solar cell.

DETAILED DESCRIPTION OF THE INVENTION

Figure 1A:
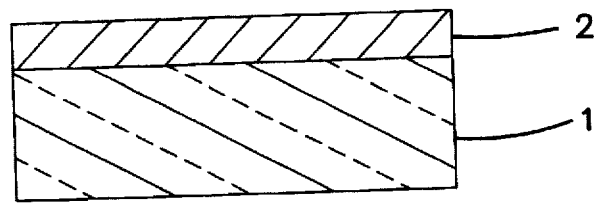
FIGS. 1(a) and (b) show part of a step of manufacturing a semiconductor thin film according to an embodiment of the present invention.
Figure 1B:
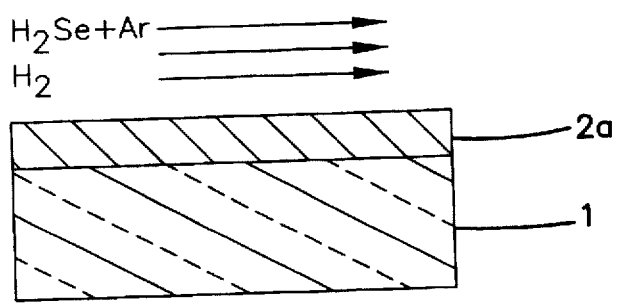

A small amount of a Group IA, VA or VB element which acts as a p type dopant is added to, or an oxide film which comprises any of these elements is laminated on an oxide thin film which comprises Groups IB and IIIA elements, whereby a precursor is formed. Then, the precursor is heat treated in an atmosphere which contains a Group VIA element. Thus, a semiconductor thin film having a chalcopyrite structure which comprises the Groups IB, IIIA, and VIA elements is produced. At the step where the semiconductor thin film is formed, the element which acts as a dopant is incorporated into the semiconductor thin film. Consequently, it is possible to obtain a film, having very few defects and impurity phases that are different from the semiconductor, as a main product. Thus, doping of the semiconductor film can be performed effectively. It is effective to provide the semiconductor film with a nonuniform distribution of carrier concentration in the thickness direction in order to enhance the efficiency of the solar cell. In a pn junction in which an n type semiconductor film is formed on a p type semiconductor having a chalcopyrite structure where the carrier concentration is increased in the vicinity of a metal layer that acts as an electrode and gradually decreases toward the film surface, an electric field is generated by the diffusion potential in the depletion layer region of the pn junction and an internal electric field is generated in the film due to a difference in carrier concentration. A small number of photo-excited carriers are transported by the internal electric field, separated by the pn junction, and supplied to the output terminals. The recombination probability is decreased more in an absorber layer by the movement of carriers caused by an electric field than by the movement of carriers caused by diffusion. Consequently, a large amount of photocurrent can be obtained. When the carrier concentration is increased in the vicinity of the pn junction, the diffusion potential becomes larger so that the open circuit voltage is increased. Accordingly, it is apparent that a solar cell having the best efficiency obtained by the combined variation of two carrier concentrations can be provided. The variation of the carrier concentration closely corresponds to that of an impurity, i.e., a dopant. By varying the Group IA element as an impurity in the thickness direction of the semiconductor thin film having a chalcopyrite structure, an internal electric field can be induced by the carrier concentration variation. Accordingly, it is apparent that the carrier concentration variation can be controlled by varying the Group IA, VA, or VB element which acts as a dopant in the oxide precursor.

In the case where a pn homo-junction of the semiconductor thin film having a chalcopyrite structure is formed, a surface or back face (the interface between the thin film and the substrate) which acts as a thin film interface should be changed to n type because a $CuInSe_2$ system thin film is a p type semiconductor. Accordingly, if the Group IIA or IIB element which acts as an n type dopant is added to the surface or the back face, the pn homo-junction can be formed. Furthermore, if the Group IA, VA or VB element which acts as a p type dopant is combined, it is possible to form a pn junction in which the diffusion potential or depletion layer width is controlled.

A precursor for manufacturing a semiconductor thin film and a method for manufacturing a semiconductor thin film according to the present invention wherein the variation of the band gap is controlled will be described below.

A metallic film that comprises two or more Group IIIA elements, i.e., In and Ga, is heat treated in an atmosphere which contains the Group VIA element, such as in a gas which contains $H_2Se$. Thus, a $Cu(In,Ga)Se_2$ film is formed. In $Cu(In,Ga)Se_2$ film, the nonuniform distribution of In and Ga sometimes occurs in the direction of film thickness due to the difference between the diffusion speeds of In and Ga, depending on the heat treating temperature. However, heat treating at a high temperature, i.e., 500° C. or more, is required in order to produce a $Cu(In,Ga)Se_2$ film having excellent crystalline quality in which a high solar cell conversion efficiency can be obtained. In this case, In and Ga are mixed uniformly. Accordingly, it is difficult to intentionally change the band gap. On the other hand, even if a two-layered oxide thin film such as a Cu-In-O and Cu-Ga-O film is sintered at a high heat treating temperature, the degree of mutual diffusion of In and Ga is low. Accordingly, if the composition ratio in the thickness direction is set to a desired composition ratio in the oxide thin film of the precursor, the sintered semiconductor thin film having a chalcopyrite structure keeps almost the same variation of the Group IIIA element as the variation in the precursor. Consequently, the variation of the Group IIIA element of the precursor is controlled so that the variation of the composition ratio of the semiconductor having a chalcopyrite structure can be set to the desired variation. Thus, the band gap can be changed.

Also, in a first embodiment in which the band gap is controlled according to the present invention, an oxide which comprises the Groups IB and IIIA elements deposited on a substrate is an oxide thin film which contains the Group IB element and at least two or more Group IIIA elements. The composition ratio of at least two or more Group IIIA elements is varied in the direction of film thickness, i.e., from the substrate to the deposited oxide thin film surface, so as to be continuously varied. For example, when the oxide thin film is formed in such a manner that the contents of Ga and In which the Group IIIA elements are decreased and increased respectively, Ga and In of the $Cu(In,Ga)Se_2$ film obtained after heat treatment in the $H_2Se$ gas are decreased and increased from the substrate to the film surface, respectively, similar to the oxide thin film. In this case, a region which contains more Ga has a larger band gap. Therefore, the $Cu(In,Ga)Se_2$ film in which the band gap is gradually narrowed from the substrate to the film surface can be obtained. If a solar cell is fabricated by using the $Cu(In,Ga)Se_2$ film as an absorber, the carriers that are photo-excited in the vicinity of the electrode comprising a substrate are moved to the pn junction face by the internal electric field generated by the change of the forbidden band gap. Accordingly, the carriers can be outputted efficiently so that the photocurrent is increased. Also, the precursor comprising multiple stacked oxide films which contain specific Group IIIA elements at different composition ratios described in a second embodiment of the present invention allows the change of the band gap to be implemented.

According to the second embodiment of the present invention wherein the band gap is controlled, oxide thin films, comprising Groups IB and IIIA elements deposited on a substrate comprise a IB-group element and at least one IIIA-group element, and the oxide thin films comprise two or more layers in which the composition ratio of specific Group IIIA elements relative to all the Group IIIA elements is varied, are sequentially deposited so that a stacked oxide thin film is formed with variation of the composition ratio of the specific Group IIIA element. In each layer, the content of the Group IB element and the Group IIIA element are the same respectively. However, the content of the specific Group IIIA element is changed in every layer. An example will be described below. In the case where a $Cu-In_{0.8}-Ga_{0.2}-O$ film and a Cu-In-O film are stacked as first and second layers, the content of the Group IB element is the same as that of the Group IIIA element in each layer, i.e., the atomic ratio is 1:1 in each layer. The content of In as the specific Group IIIA element is 0.8 in a first layer and 1 in a second layer. As a matter of course, each layer may include two or more kinds of Group IIIA elements. In the case where a $Cu-In_{0.6}-Ga_{0.4}-O$ film and a $Cu-In_{0.8}-Ga_{0.2}-O$ film are combined as first and second layers, the content of the Group IB element is the same as that of the Group IIIA element in each layer, i.e., the atomic ratio is 1:1 in each layer. The content of In as the specific Group IIIA element is 0.6 in a first layer and 0.8 in a second layer. Such a case is included in the second embodiment. Also in the second embodiment, in the case where a semiconductor thin film having a chalcopyrite structure is produced from the oxide film, the composition ratio of the Group IB element and Group IIIA element of each oxide thin film is maintained so that the forbidden band gap can be changed by a multi-layered film.

According to a third embodiment of the present invention in which the band gap is controlled, two or more kinds of oxide thin films having different Group IIIA elements are sequentially deposited to form an oxide thin film having two or more layers, in which the Group IIIA element is varied as the oxide thin films which comprise the Groups IB and IIIA elements are deposited on a substrate. In the case where a precursor which is formed by sequentially depositing a Cu-Ga-O film and a Cu-In-O film on an electrode used as the substrate the band gap is rapidly changed in the vicinity of the substrate if a semiconductor thin film having a chalcopyrite structure is produced from the oxide thin film. Consequently, it is difficult for photocarriers generated in the vicinity of the electrode to move to the electrode due to an internal electric field caused by the rapid change of the band gap. Thus, the recombination which occurs at the electrode can be prevented. Accordingly, the carriers can be efficiently outputted.

According to a preferred embodiment of the present invention (of the type in which the band gap is controlled), the Group IIIA element includes at least Ga in the deposited oxide thin film comprising Groups IB and IIIA elements that is in contact with the substrate side since a material such as $CuGaSe_2$ or $CuGaS_2$ has better adhesion than $CuInSe_2$ or $CuInS_2$ when a metal body or a metal film is used as a substrate. Accordingly, when a film that contains at least Ga, for example a Cu-Ga-O film or a Cu-In-Ga-O film, is deposited on the substrate and sintered, a semiconductor thin film having a chalcopyrite structure which has excellent adhesion to the substrate can be obtained.

According to a preferred embodiment in which a substrate is a metal body substrate or an insulative substrate coated with a metal thin film, which a precursor for manufacturing a semiconductor thin film of the present invention in which the band gap is controlled, the metal body substrate or metal thin film can be used as an electrode of the solar cell. The precursor according to the present embodiment can be used for a so-called back side type solar cell which is used by irradiating light on the semiconductor thin film through a transparent substrate.

By using an oxide thin film deposited on a transparent insulator such as glass that is coated with a transparent conductive film, or on a transparent insulator such as a glass that is coated with the transparent conductive film and a transparent insulator film, a semiconductor thin film having a chalcopyrite structure is formed. The semiconductor thin film can be applied effectively to a superstrate type solar cell which develops electromotive force by irradiating sunlight on the transparent insulator face that is not coated with the transparent conductive film. In this case, a pn junction layer is formed in the vicinity of the substrate surface. Consequently, Ga is gradually increased from the substrate to the semiconductor thin film surface, conversely to the above-mentioned embodiment, so that an internal electric field which moves the photocarriers to the pn junction layer can be generated.

According to a method for manufacturing a semiconductor thin film of the present invention (of the forbidden band gap controlled type), a precursor for manufacturing the semiconductor thin film described above is heat treated in an atmosphere containing a Group VIA element so that a semiconductor thin film having a chalcopyrite structure which comprises Groups IB, IIIA, and VIA elements is formed. As described above, the change of composition (composition variation) of the Group IIIA elements in the direction of the film thickness can be set to a desired composition ratio by using the oxide thin film precursor. Even if the oxide thin film is heat treated in the atmosphere containing the Group VIA element to obtain the semiconductor thin film having a chalcopyrite structure, the degree of interdiffusion of the Group IIIA elements contained in the oxide thin film, for example, the degree of interdiffusion of In and Ga, is small. Accordingly, if the composition ratio of the Group IIIA elements in the direction of film thickness is set to a desired composition ratio in the oxide thin film of the precursor, the variation of the Group IIIA element is closely maintained in the semiconductor thin film having a chalcopyrite structure after sintering. Consequently, when the variation of the Group IIIA element of the precursor is controlled, the variation of the composition ratio of the semiconductor having a chalcopyrite structure can be set to the desired variation. Thus, the band gap can be changed in the thickness direction of the semiconductor thin film.

In the method for manufacturing a semiconductor thin film according to the present invention described above, it is preferred that heat treatment is performed in the presence of at least one of hydrogen and carbon monoxide. The reaction in which the oxide thin film is heat treated in the atmosphere containing the Group VIA element to produce the semiconductor thin film having a chalcopyrite structure mainly comprises a reduction reaction in which an oxide is reduced. The hydrogen or carbon monoxide has the reducting function so that the conversion of the oxide to the semiconductor thin film can be promoted.

In the method for manufacturing a semiconductor thin film according to the present invention described above, it is preferred that heat treatment is performed at a temperature of 200° C. to 1000° C. Consequently, the reducing reaction is promoted well at a temperature of 200° C. to 1000° C. and a product is rarely decomposed.

By employing, as an absorber, the semiconductor thin film using the precursor according to the present invention, a solar cell having a high and uniform energy conversion efficiency over a large area and excellent productivity can be provided.

Thus, the present invention provides a precursor for manufacturing a semiconductor thin film and a method for manufacturing a semiconductor thin film suitable for a solar cell having a high energy conversion efficiency and excellent productivity.

Examples of the Group IB element used for the present invention are Cu and Ag. In particular, Cu is more preferable in terms of cost. Examples of the Group IIIA elements are Ga, In, and Al. Ga and In are more preferable. Examples of an element which acts as a p type dopant are Li, Na, K, Rb, Cs, Fr, and the like. Examples of the Group VA element are N, P, As, Sb, and Bi. Examples of the Group VB element are V, Nb, and Ta. In terms of cost, the crystalline quality of the semiconductor thin film having chalcopyrite structure which has been sintered, safety of handling, and activation as a dopant, Li, Na, and K of the Group IA element, P of the Group VA element, and Nb and Ta of the Group VB element are more preferable. Example of elements which act as an n type dopant are as follows. Examples of the Group IIA element are Be, Mg, Ca, Sr, Ba, Ra, and the like. Examples of the Group IIB element are Zn, Cd, and Hg. In terms of safety, Mg, Ca, Sr, and Ba of the Group IIA elements and Zn of the Group IIB elements are more preferable. Furthermore, S, Se, and Te are used as the Group VIA elements. In particular, S and Se are more preferable because they provide a band gap suitable for the absorption of sunlight.

When heat treating the oxide thin film precursor including the Groups IB and IIIA elements as main components according to the present invention in the atmosphere containing the Group VIA element so as to form the semiconductor thin film having a chalcopyrite structure which comprises the Groups IB, IIIA, and VIA elements, a substance which contains the Group VIA element can be used, for example, a simple compound of the Group VIA element, a hydride such as $H_2Se$ or $H_2S$, a carbide such as $CS_2$, and an organometallic compound such as $(CH_3)_2Se$ or $(C_2H_5)_2Se$. In particular, the hydride of the Group VIA element is more preferable.

Preferred examples of the present invention will be described with reference to the drawings. The present invention is not restricted to the following examples.

EXAMPLE 1

FIGS. 1(a) and (b) are sectional views showing the typical steps of manufacturing a semiconductor thin film having a chalcopyrite structure according to an example of the present invention. As shown in FIG. 1(a), glass coated with a Mo film is used as a substrate 1. When manufacturing a solar cell, Mo can be preferably used as an ohmic electrode. For this reason, the glass substrate was coated with Mo in advance. Then, a Cu-In-O:$Na_2O_2$ film was sputter-deposited, as an oxide thin film precursor 2 comprising Groups IA, IB, and IIIA elements, on the Mo film. The Cu-In-O:$Na_2O_2$ film means an oxide film of Cu and In containing $Na_2O_2$ (Na oxide) as a dopant. Sputter deposition was performed in an Ar atmosphere containing 5 vol % of $O_2$ at a vacuum of $8 \times 10^{-3}$ Torr by the high frequency magnetron sputtering method using, as a target, a sintered body that contains $Na_2O_2$ in $Cu_2In_2O_5$. The thickness of the Cu-In-O:$Na_2O_2$ film thus formed is 1.0 μm. Four kinds of oxide precursors having Na contents of about 1 atomic % to 10 atomic % were formed. The substrate coated with the oxide thin film was put in a silica tube and heat treated for 1 hr. at a temperature of 550° C. in an atmosphere containing 3 vol % of $H_2Se$ which is Ar-diluted and $H_2$ ($H_2Se+Ar:H_2=$ 5:1 by volume) to form a $CuInSe_2$:Na thin film as a semiconductor thin film having a chalcopyrite structure comprising Groups IB, IIIA and VIA elements (wherein ": Na" means that Na is contained as a dopant).

Figure 2:
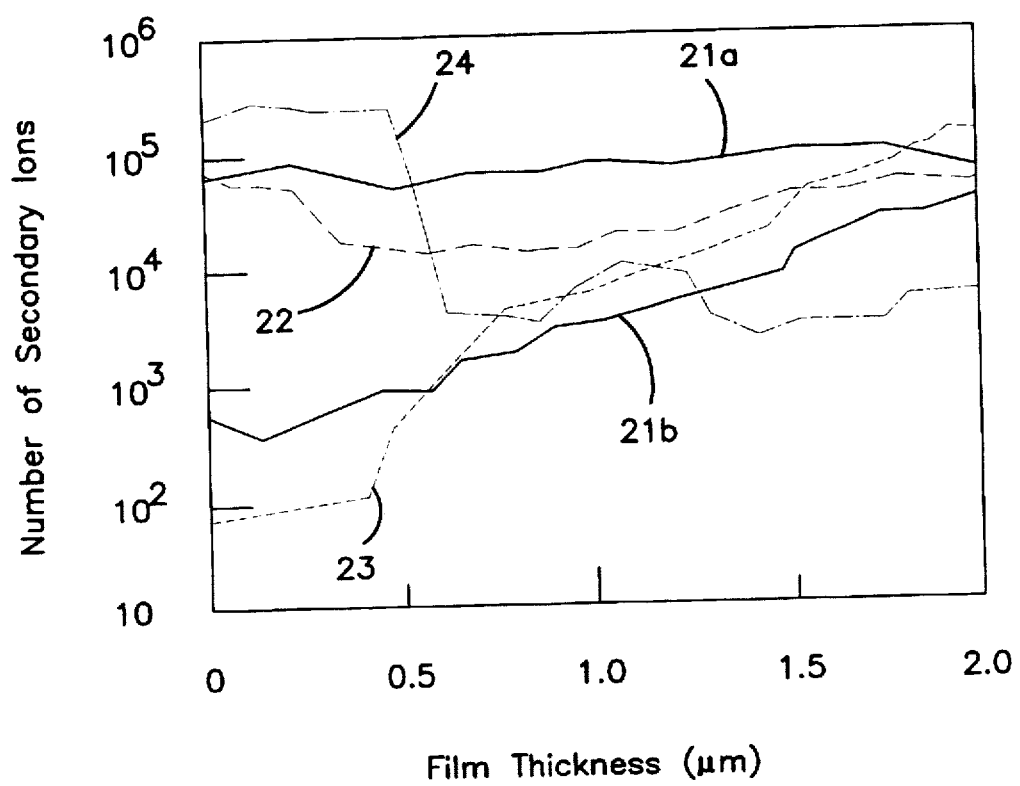
FIG. 2 is a graph showing the variation of a Group IA element in the thickness direction of a semiconductor thin film having a chalcopyrite structure obtained by the method of the present invention, which is measured by a secondary ion mass spectroscope (SIMS).

Curve 21a of FIG. 2 shows the result obtained by measuring the Na variation in the thickness direction of the $CuInSe_2$:Na thin film having a Na content of a 5 atomic % by secondary ion mass spectroscopy (SIMS). The abscissa indicates film thickness, wherein a film thickness of 0 represents the surface of the formed film. It is apparent that Na is uniformly contained in the direction of the film thickness.

Figure 3:
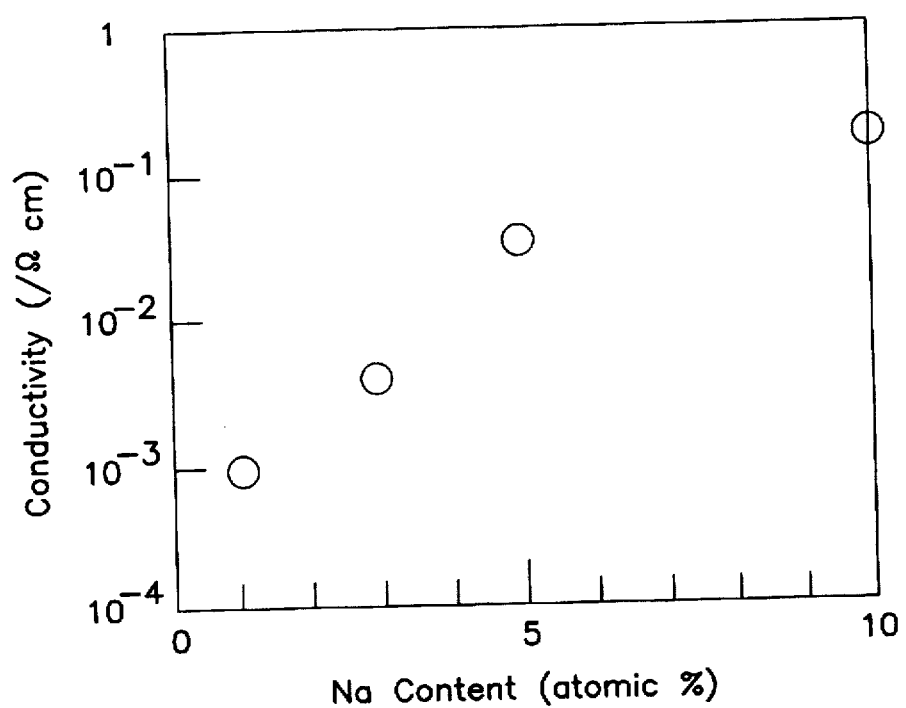
FIG. 3 is a chart showing the change of the conductivity of a $CuInSe_2$:Na film with change in the content of Na.

FIG. 3 shows the change of the conductivity of the $CuInSe_2$:Na thin film with Na content. It is apparent that the conductivity rises as the Na content is increased. If the Na content is less than 5 atomic %, the conductivity rises rectilinearly. When the Na content reaches 10 atomic %, the rate of rise is decreased. The reason is that Na contained in the film functions as a dopant effectively with a Na content of 5 atomic % or less to increase the carrier concentration and that the rate at which Na contained in the film functions as a dopant is decreased with a Na content of 10 atomic %. In some cases, a large amount of dopant greatly changes the properties of a semiconductor. It is apparent that the Na content is preferably 5 atomic % or less in the present example.

According to the oxide thin film that comprises Groups IB and IIIA elements and an element which acts as a dopant, the carrier concentration of the semiconductor thin film having a chalcopyrite structure which is finally obtained can be controlled by the amount of the element added as a dopant. In this case, when the element which acts as a dopant is uniformly contained over the film thickness, the carrier distribution becomes uniform. Such a structure can be formed most easily, and is suitable for mass production.

Figure 4:
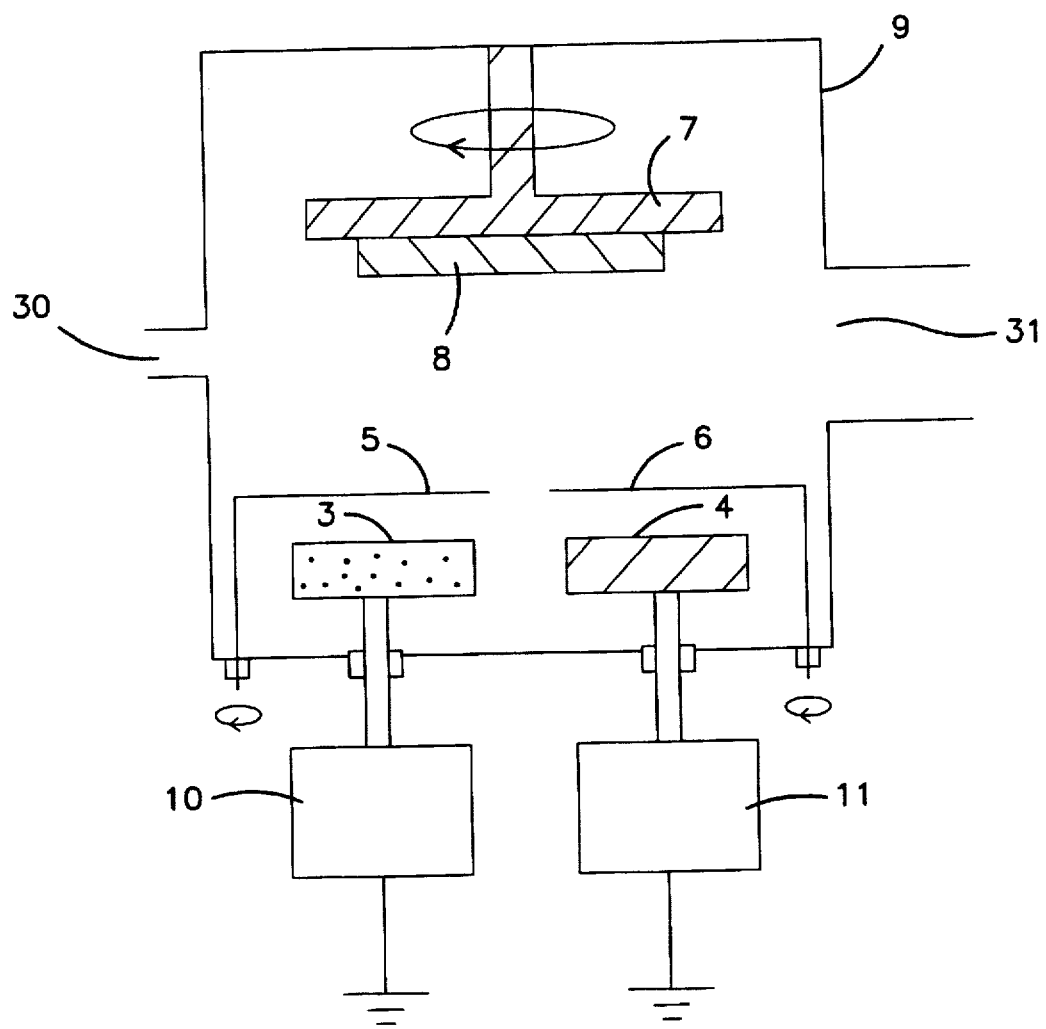
FIG. 4 is a sectional view schematically showing a sputtering device for manufacturing an oxide precursor for the formation of a semiconductor thin film according to an embodiment of the present invention.

By using a device shown in FIG. 4, an oxide precursor in which the amount of Na is varied in the thickness direction of the film can be formed. A sintered body of $Cu_2In_2O_5$:$Na_2O_2$ having a Na content of 10 atomic % is used as a target 3, and a sintered body of $Cu_2In_2O_5$ which does not contain Na is used as a target 4. These targets are simultaneously sputtered in an Ar atmosphere containing 5 vol % of $O_2$ at a vacuum of $8\times10^{-3}$ Torr. The reference numeral 30 designates gas inlet, and the reference numeral 31 designates a gas outlet. During sputtering, shutters 5 and 6 were opened, and particles ejected from the sputtered targets were deposited on a substrate 8 mounted on a rotating substrate holding table 7 in order to obtain a uniform composition across the film surface direction. By adjusting the applied power of high voltage target power supplies 10 and 11, the rates at which Cu-In-O:$Na_2O_2$ and Cu-In-O are deposited can be controlled. Accordingly, the power applied to the targets is changed so that the Cu-In-O:$Na_2O_2$ film in which the amount of Na is varied in the direction of film thickness can be deposited on the substrate. From the start to the end of film deposition, the power applied to the $Cu_2In_2O_5$:$Na_2O_2$ target is rectilinearly changed from 1 KW to 100 W and the power applied to the $Cu_2In_2O_5$ target is rectilinearly changed from 200 W to 1 KW. A curve 21b of FIG. 2 shows the result obtained by measuring the Na variation of the $CuInSe_2$:Na thin film, which is reduced by heat treating the Cu-In-O:$Na_2O_2$ film under the above conditions, by secondary ion mass spectroscopy (SIMS). It is apparent that the amount of Na is increases from the film surface side to the film substrate side in the thickness direction. Accordingly, it is seen that the Na variation of the precursor is essentially maintained in the semiconductor thin film having a chalcopyrite structure. Thus, the element which acts as the dopant of the precursor is varied in the thickness direction so that the variation of the carrier concentration described above can be formed in the thickness direction of the semiconductor film. Consequently, the efficiency of the solar cell can be enhanced.

Na as the Group IA element was used as the dopant in the present example. Also, in the case where P of the Group VA elements and Nb and Ta of the Group VB elements were used, the same results were obtained. In particular, when using Nb and Ta, the variation of the dopant element of the precursor was almost completely maintained in the final $CuInSe_2$ film.

EXAMPLE 2

Figure 5:
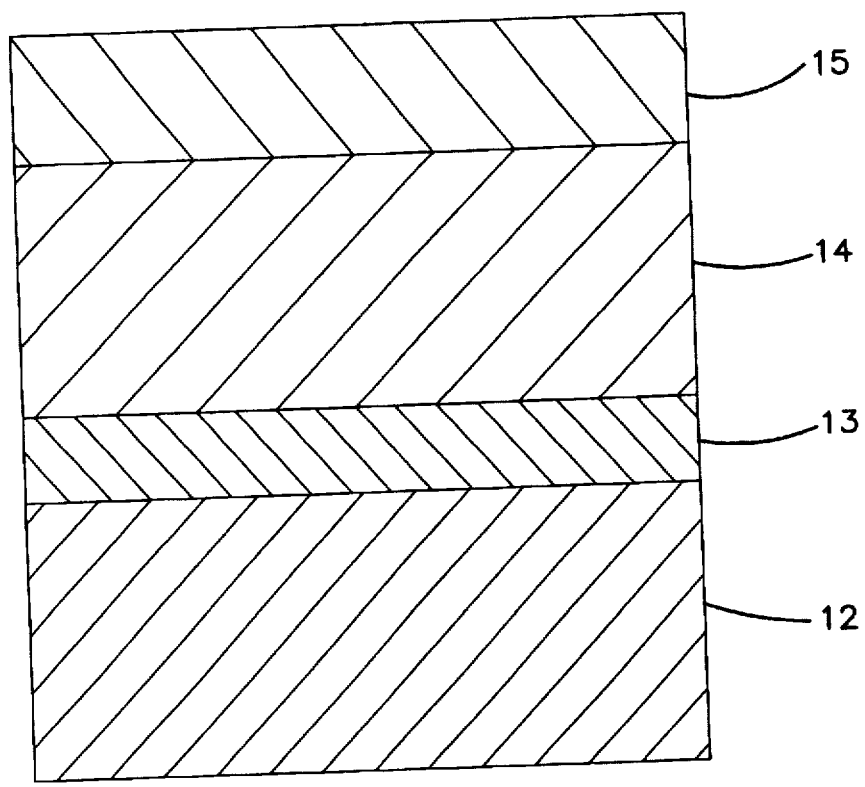
FIG. 5 is a sectional view showing the structure of a precursor for producing a semiconductor thin film according to an embodiment of the present invention.

FIG. 5 is a sectional view showing the structure of a precursor formed of an oxide thin film according to an embodiment of the present invention. Stainless steel coated with Mo was used as a substrate 12. A Cu-In-Ga-O:$K_2O_2$ film 13 having a K content of 2 atomic %, a Cu-In-Ga-O:$K_2O_2$ film 14 having a K content of 1 atomic %, and a Cu-In-Ga-O:$K_2O_2$ film 15 having a K content of 5 atomic % were sequentially deposited on the substrate 12. Deposition was performed by sputtering under the same conditions as in Example 1. Each film was produced by using a target in which $K_2O_2$ is contained in $Cu_2In_2O_5$ in such a manner that K content has the above ratio. The composition ratio of elements of each film or target is constant, i.e., a Cu/(In+Ga)=0.0, In/(In+Ga)=0.9. The substrate coated with the oxide thin film was placed in a silica tube and heat treated for 1 hr. at a temperature of 550° C. in an atmosphere containing $H_2S$ and $H_2$ ($H_2S$:$H_2$=1:4 volumetric ratio). Thus, a semiconductor thin film having a chalcopyrite structure which comprises Groups IB, IIIA, and VIA elements, i.e., Cu(In, Ga)$S_2$:K thin film was formed.

In FIG. 2, curve 22 shows the result obtained in measuring the K variation in the thickness direction of the Cu(In, Ga)$S_2$:K thin film by SIMS. Although slight diffusion is caused by heat treatment, the K variation shown in FIG. 2 almost corresponded to the K variation obtained when manufacturing the precursor.

By depositing an oxide thin film that comprises a plurality of elements that act as dopants with different content ratios and Groups IB and IIIA elements, a complicated variation of a carrier concentration in the direction of film thickness as described above can be formed comparatively easily and with great precision. Accordingly, the present invention is effective in controllably varying the elements as dopants in the oxide thin film with great precision.

EXAMPLE 3

Figure 6:
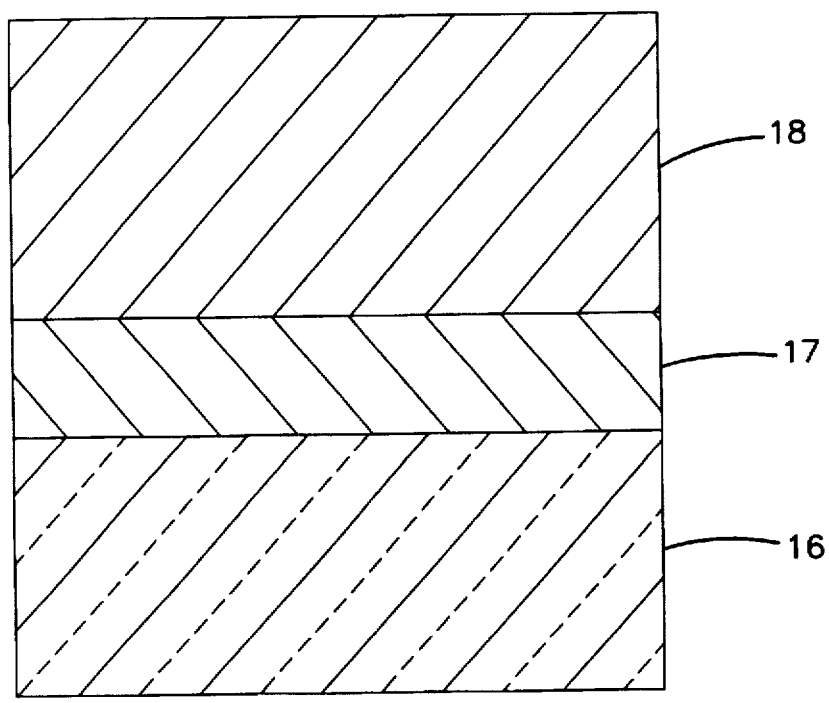
FIG. 6 is a sectional view showing the structure of a precursor for producing a semiconductor thin film according to another embodiment of the present invention.

FIG. 6 is a sectional view showing the structure of a precursor formed of an oxide thin film according to another embodiment of the present invention. Glass coated with a Mo film was used as a substrate 16. Group IA oxide thin film 17, i.e., $Li_2O_2$, was deposited on the substrate 16. A Cu-In-O film 18, i.e., comprising Groups IB and IIIA elements, was deposited on the $Li_2O_2$ film. The $Li_2O_2$ film was produced by high-frequency sputtering of a $Li_2O_2$ target at 1 KW in an Ar atmosphere containing about 5 vol % of $O_2$ at a vacuum of $8\times10^{-3}$ Torr. The Cu-In-O film was produced by sputtering in an Ar atmosphere containing 5 vol % of $O_2$ at a vacuum of $8\times10^{-3}$ Torr using a sintered body of $Cu_2In_2O_5$ as a target. Five kinds of films were produced, in which the thickness of the $Li_2O_2$ film as a first layer is varied within 10 to 100 nm. The thickness of the Cu-In-O film was constant, i.e., 0.8 μm. The obtained oxide precursors were placed in a silica tube and heat treated for 1 hr. at a temperature of 550° C. in a mixed $CS_2$ and CO atmosphere in which $H_2$ gas was flowed as a carrier gas. Thus, $CuInS_2$:Li films were produced.

In FIG. 2, curve 23 shows the variation of Li in the direction of the thickness of the $CuInS_2$:Li film which was produced by sulfurization of the precursor in the case where the $Li_2O_2$ film has a thickness of 50 nm, in which the amount of Li is gradually increased from the film surface to the substrate side. It is presumed that Li is varied in the film as shown because it has a small atomic radius or ionic radius permitting easy diffusion.

Figure 7:
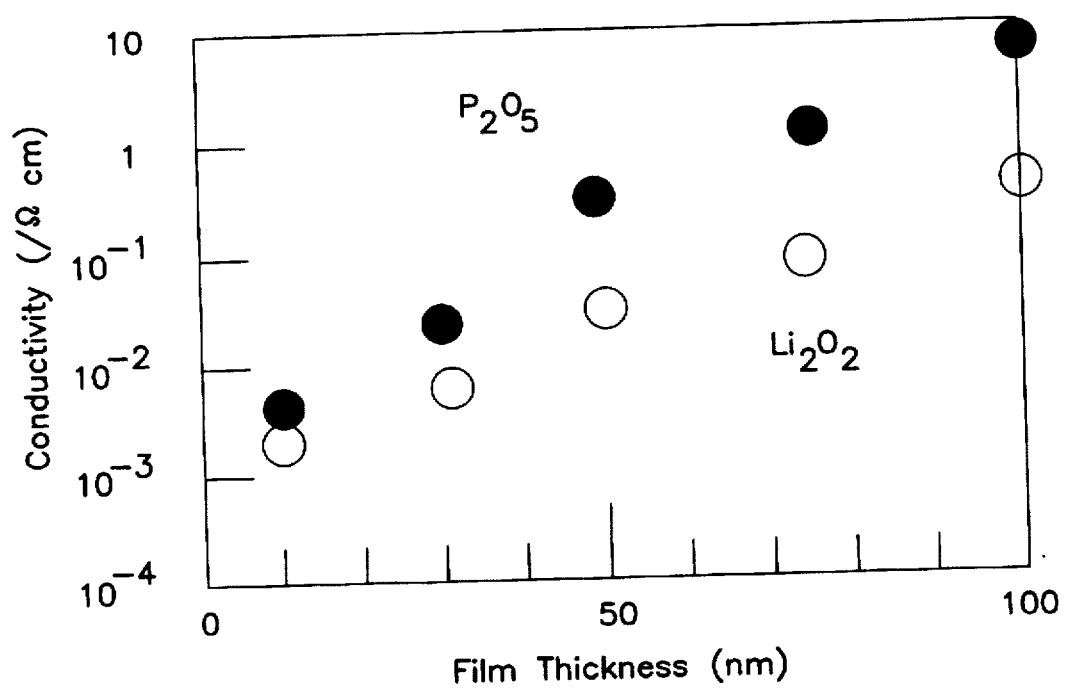
FIG. 7 is a chart showing the change of the conductivity of a $CuInS_2$ film with respect to the thicknesses of $Li_2O_2$ and $P_2O_5$ films.

In FIG. 7, the symbol ○ shows the change of the conductivity of the $CuInS_2$:Li film with the thickness of the $Li_2O_2$ film. It is apparent that the conductivity is increased as the thickness of the $Li_2O_2$ film is increased. Consequently, it is seen that the conductivity or carrier concentration of the semiconductor thin film can be controlled easily according to the thickness of the $Li_2O_2$ film.

The present invention allows for easily controlling the amount of the dopant element of the oxide thin film with high precision. An oxide thin film comprising Groups IB and IIIA elements and an oxide thin film that acts as the dopant are alternately deposited to form a plurality of layers. Thus, the composition ratio of the elements that act as the dopants can be controlled comparatively precisely according to the film thickness ratio. In a structure where a solar cell is formed on a metal body or a metal film, an oxide film comprising a dopant element is deposited on the metal body or metal film and an oxide film comprising Groups IB and IIIA elements is deposited on the oxide film comprising the dopant element so that the carrier concentration is increased in the vicinity of the metal body interface or metal film interface. In this case, an electric field is formed in the vicinity of the metal body interface or metal film interface. Consequently, most of the photocarriers that are excited in the vicinity of the metal body interface or metal film interface move to the $CuInS_2$:Li film surface. Accordingly, recombination of the carriers can be prevented from occurring at the metal body interface or metal film interface. Thus it is possible to increase the photocurrent that can be obtained when using the solar cell.

EXAMPLE 4

A $CuInS_2$:P film was manufactured by using an oxide thin film comprising $P_2O_5$ as a dopant in place of $Li_2O_2$ in the same manufacturing process as in Example 3. In FIG. 6, glass coated with a Mo film was used as a substrate 16. An oxide thin film 17 comprising a Group VA element, i.e., $P_2O_5$ film, was deposited on the substrate 16. A Cu-In-O film 18 comprising Groups IB and IIIA elements was deposited on the $P_2O_5$ film. The $P_2O_5$ film was produced by vacuum deposition by heating $P_2O_5$ powder to about 350° C. Cu-In-O was produced by the sputtering method under the same conditions as in Example 3. Five kinds of films were produced, in which the thickness of the $P_2O_5$ film as a first layer is varied within 10 to 100 nm. The thickness of the Cu-In-O film was constant, i.e., 0.8 μm. The obtained oxide precursors were placed in a silica tube and heat treated for 1 hr. at a temperature of 550° C. in a mixed $CS_2$ and CO atmosphere in which $H_2$ gas flowed as a carrier gas. Thus, $CuInS_2$:P films were produced.

In FIG. 7, the symbol ● shows the change of the conductivity of the $CuInS_2$:P film with the thickness of the $P_2O_5$ film. It is apparent that the conductivity is increased as the thickness of the $P_2O_5$ film is increased, similarly to the $Li_2O_2$ film. As compared with $Li_2O_2$, $P_2O_5$ has a higher conductivity for the same film thickness. Since it is necessary to compare densities and the like, the reasoning does not hold easily. However, it is presumed that $P_2O_5$ functions as a better dopant because of substitution of Se for P. In addition, $P_2O_5$ has stability and is not toxic, and thus is advantageous in respect of safety of handling.

Also, when $Nb_2O_5$ and $Ta_2O_5$ are used in place of $P_2O_5$, the same results can be obtained. However, $Nb_2O_5$ and $Ta_2O_5$ are inferior to $P_2O_5$ in increasing conductivity. It is presumed that Nb and Ta are not substituted for Se but form $Nb_2Se_5$ and $Ta_2Se_5$ to generate a Se vacancy, which functions as an acceptor for supplying a hole.

EXAMPLE 5

An embodiment that can be applied to a superstrate type solar cell having a structure in which light is incident on a glass face will be described below. Glass was used as a substrate on which a transparent conductive film $ZnO:Al_2O_3$ ($Al_2O_3$ content of 2 wt %) and a transparent insulating film ZnO were sequentially deposited in thicknesses of 1.5 μm and 0.1 μm. A film comprising Group IB and IIIA elements (Cu-In-O) was deposited on the substrate in a thickness of about 1.0 μm by the sputtering method similar to Example 1. A $Na_2O_2$ film was deposited on the Cu-In-O film in a thickness of 50 nm by the sputtering method under the same conditions as in the deposition of the $Li_2O_2$ film in Example 3. The obtained oxide precursor was placed in a silica tube, and heat treated for 1 hr. at a temperature of 550° C. in an atmosphere of flowing $H_2$ gas as a carrier gas (50 sccm) and $(C_2H_5)_2Se$ vapor flow. Thus, a $CuInS_2$:Na film was produced.

In FIG. 2, curve 24 shows the variation of Na in the thickness direction of the obtained film. Conversely to Example 3, it is apparent that a large amount of Na is present on the film surface and is rapidly decreased at a depth of about 0.5 μm. Na is slightly thermally diffused because of a larger atomic radius than that of Li of Example 3. Consequently, the variation is not extended over the film. Such variation is also effective in producing a solar cell. In the structure of the solar cell using the film of the present example, a pn junction was formed by n type ZnO and p type $CuInSe_2$, close to the substrate. If Na is not doped, carriers which are excited on the film surface distant from the glass substrate are not influenced by an electric field generated by the pn junction present in the vicinity of the substrate. Accordingly, the carriers move to the film surface and the substrate side at half probability, respectively. An electrode is formed on the film surface. For this reason, carrier recombination is caused through the electrode so that the carriers are outputted with difficulty. According to the structure of the present invention, however, a difference in carrier concentration generates the electric field because the carrier concentration is almost equal to the variation of the amount of Na dopant atoms. Because of generated electric field, it is hard for the photocarriers excited in the vicinity of the film surface to move to the film surface. Consequently, almost all the photocarriers move to the substrate side. The photocarriers are outputted through the electric field generated by the pn junction. Accordingly, the photocurrent is increased.

The precursor which was formed by laminating an oxide film comprising the Group IA element and an oxide film comprising the Groups IB and IIIA elements was used in Examples 3 and 5. According to this structure, the films can be deposited individually so that it is not necessary to sputter two or more targets at the same time. Consequently, contamination of the targets can be prevented and excellent reproducibility can be obtained. These advantages are effective in the uniform and mass production of a solar cell.

While $Li_2O_2$, $Na_2O_2$, or $K_2O_2$ was used as an additive of an oxide film comprising the Group IA element or an oxide target comprising the Groups IA, IB, and IIIA elements in Examples 1 to 3 and 5, the same effects could be obtained even if $Li_2O_2$, $Na_2O_2$, or $K_2O$ is used.

EXAMPLE 6

A solar cell was manufactured by using a semiconductor thin film having a chalcopyrite structure produced in Example 1. A film having a Na content of 5 atomic % as in Example 1 (shown by the curve 21a of FIG. 2) and a film in which the amount of Na is decreased on the film surface side (shown by the curve 21b of FIG. 2) were used. For comparison, a CuInSe$_2$ film was also used. The CuInSe$_2$ film was formed by selenization of a Cu-In-O film which does not contain Na, by the same method as in Example 1. A CdS film was deposited as an n type window layer in a thickness of about 50 nm of a CuInSe$_2$:Na film and in the CuInSe$_2$ film for comparison by the solution deposition method using thiourea, cadmium chloride, and aqueous ammonia having a concentration of 1.5 wt %. A ZnO film and a ITO film (In$_2$O$_3$ SnO having a SnO content of 5 wt %) were deposited as transparent conductive films in thicknesses of 50 nm and 500 nm, respectively, on the CdS film by sputtering method. The solar cell using the semiconductor thin film shown by the curve 21a of FIG. 2 had an open circuit voltage Voc of 0.050 V, a short circuit photocurrent Jsc of 40 mA/cm$^2$, a fill factor FF of 0.72, and a conversion efficiency of 15% under light irradiation of Am1.5, 100 mW/cm$^2$. In the case of use of the semiconductor thin film shown by the curve 21b of FIG. 2, the solar cell had a Voc of 0.48 V, Jsc of 45 mA/cm$^2$, FF of 0.74, and a conversion efficiency of 16%. On the other hand, the solar cell characteristics of a comparison to which Na is not added had a Voc of 0.40 V, Jsc of 42 mA/cm$^2$, FF of 0.68, and a conversion efficiency of 11%. As described above, it is apparent that the efficiency of the solar cell using the film to which the Group IA element is added is larger than that of the solar cell using a comparison film to which the Group IA element is not added. In particular, the open circuit voltage is higher. The reason is that the addition of the Group IA element increases the carrier concentration of the film and the diffusion potential of the pn junction. With the solar cell using the semiconductor thin film shown by the curve 21b of FIG. 2 in Example 1 in which the amount of the Group IA element of the film is not constant in the direction of the film thickness, the short circuit photocurrent is also larger than that of the solar cell using the comparison film. The reason is that an internal electric field is generated in the film so that the photo-excited carriers are collected efficiently in the pn junction area, as described above.

The films of Examples 2, 3, and 5 were also used to produce solar cells. As a result, each solar cell had an increased efficiency by 2 to 4% over a solar cell using a film to which the Group IA element was not added.

From the foregoing, it is seen that the efficiency of the solar cell can be enhanced by the addition of the Group IA element.

EXAMPLE 7

Figure 8:
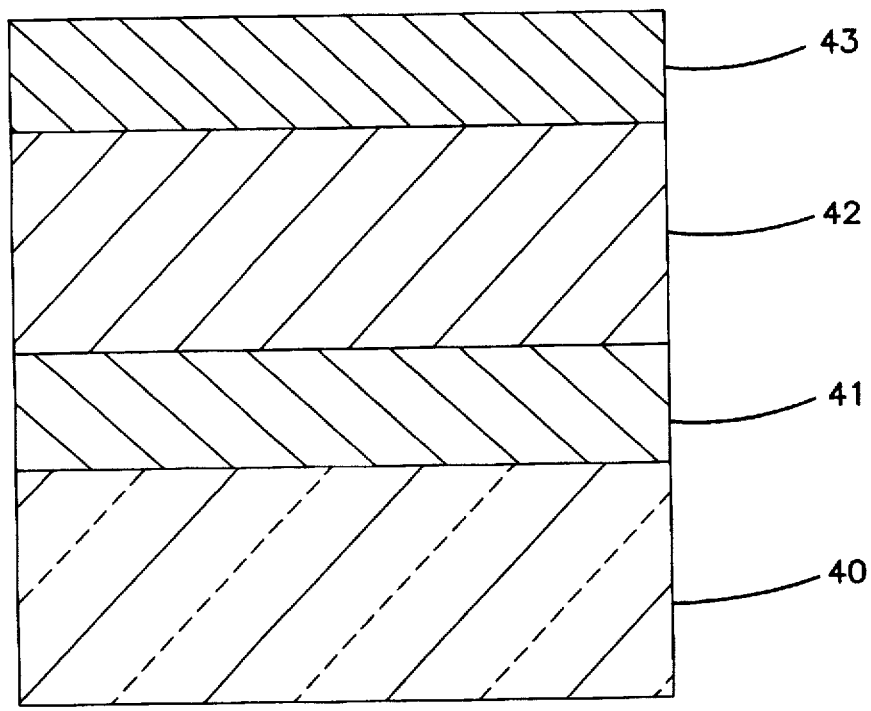
FIG. 8 is a sectional view showing the structure of a precursor for producing a semiconductor thin film according to an embodiment of the present invention.

FIG. 8 is a sectional view showing the structure of an oxide thin film precursor according to an embodiment of the present invention. Glass coated with a Mo film was used as a substrate 40. A thin film of oxide 41 comprising a Group VA element, i.e. P$_2$O$_5$, was deposited on the substrate 40. A Cu-In-O film 42 comprising Groups IB and IIIA elements was deposited on the P$_2$O$_5$ film. A MgO film 43 as a thin film oxide comprising a Group IIA element was deposited on the Cu-In-O film 42. The P$_2$O$_5$ film was formed in a thickness of about 50 nm by the vacuum deposition method under the same conditions as in Example 4. The Cu-In-O film was produced by sputtering method under the same conditions as in Example 3. The MgO film was produced in an Ar atmosphere containing 10 vol % of O$_2$ at a vacuum of 8×10$^{-3}$ Torr by a high frequency magnetron sputtering method in which a MgO sintered body acts as a target. MgO thus produced had a thickness of 50 nm. The obtained oxide precursor was placed in a silica tube and heat treated for 1 hr. at a temperature of 550° C. in a mixed H$_2$ and H$_2$S atmosphere. Thus a CuInS$_2$ film in which P and Mg are partially doped was produced.

Figure 9:
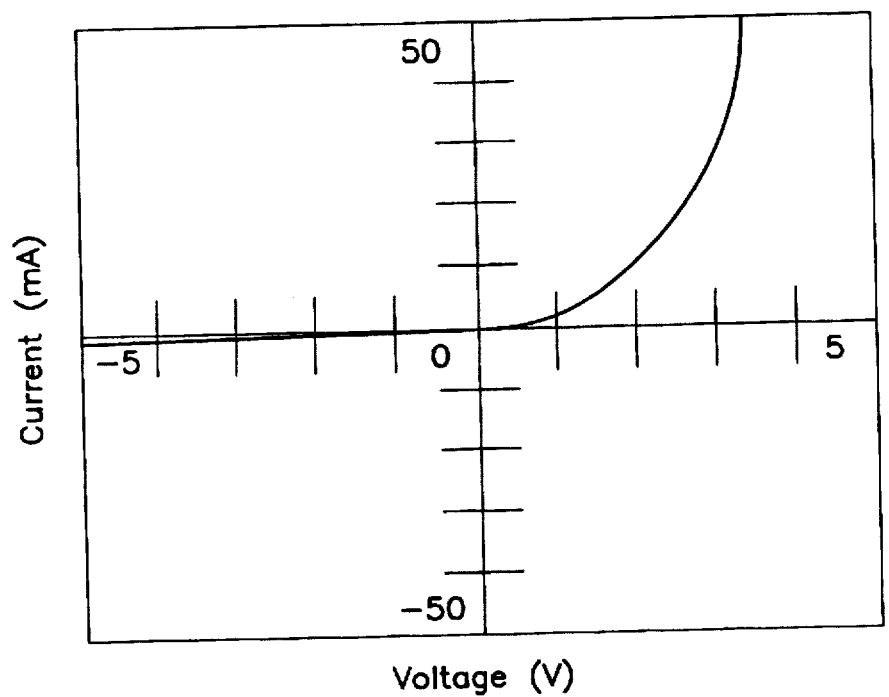
FIG. 9 is a chart showing the voltage-current characteristic of a $CuInS_2$ film in which Mg and P are doped.

An Au electrode film was formed in a thickness of about 0.2 μm on the obtained CuInS$_2$ film by the electron beam deposition method. A voltage was applied to the Mo film to measure the electric characteristics, wherein the Au film acts as a ground. FIG. 9 shows voltage-current characteristics. It is apparent that the rectifying characteristics in which the Mo film side is p type and the Au electrode side is n type is shown. Accordingly, it was confirmed that an n type CuInS$_2$ layer in which Mg of the Group IIA element acts as a donor is formed on the CuInS$_2$ film surface and a pn homo-junction is formed.

Also, in the case where a ZnO film comprising Zn as the Group IIB element was used as an oxide thin film containing elements which act as dopants, the same results were obtained.

Glass coated with an ITO film was used as the substrate 40. The MgO film, the Cu-In-O film, and the P$_2$O$_5$ film were used for the oxide thin films 41, 42, and 43 respectively. Thus, a precursor having the reverse structure to that of the above Examples was formed. The precursor was sulfurized to produce a CuInS$_2$ film in which Mg and P are partially doped. Also, when an Au electrode film was formed on the CuInS$_2$ film surface to measure voltage-current characteristics, the same rectifying characteristics were observed. In this case, the CuInS$_2$ layer on the ITO film side was n type and the CuInS$_2$ layer on the Au film side was p type.

Thus, the oxide thin film comprising the Groups IIA and IIB elements is deposited on the oxide thin film comprising Groups IB and IIIA elements and heat treated so that an n type semiconductor thin film having a chalcopyrite structure can be produced easily. Accordingly, it is not necessary to expose the formed p type semiconductor thin film to the air in order to form an n type window layer. Thus, it is possible to prevent the formation of oxide layers and impurity layers on the pn junction interface. Consequently, the number of centers for carrier recombination is not increased and energy barriers are not generated by the oxide layers and the impurity layers. Hence, the conversion efficiency of the solar cells can be enhanced. In addition, the nonuniformity of the conversion efficiency owing to generation of the oxide layers and the impurity layers can be prevented. Thus, uniform conversion efficiency can be realized over a large area. Accordingly, the semiconductor thin film solar cell having a pn homo-junction chalcopyrite structure according to the present invention has excellent productivity and is industrially advantageous.

EXAMPLE 8

An oxide thin film was deposited by the following method using the same sputtering device as in FIG. 4. Glass coated with Mo was used as a substrate 8. In the case where a solar cell is produced, Mo is preferably used as an ohmic electrode. For this reason, the glass substrate is coated with Mo in advance. Sintered bodies of Cu-Ga-O and Cu-In-O were used as oxide targets 3 and 4. A mixed gas of Ar and O$_2$ (volumetric ratio Ar:O$_2$=95:5) was introduced from gas inlet 30. At a vacuum of 8×10$^{-3}$ Torr, a high voltage was applied to a substrate holding plate 7 and targets 3 and 4, the gas was ionized, and the targets were sputtered. At this time, shutters 5 and 6 were opened, and particles which are ejected from the sputtered targets are deposited on the substrate 8 during a rotation of substrate holding plate 7 in order to obtain a uniform composition across the surface of the film. By adjusting the power applied to the high voltage supplies 10 and 11 of the targets, the deposition rates of Cu-Ga-O and Cu-In-O could be controlled. Thus, a Cu-In-Ga-O film having a desired composition ratio can be deposited on the substrate according to the power applied to the targets. From the start to the end of the film deposition, the power applied to the Cu-Ga-O target was rectilinearly changed from 1 KW to 100 W and the power applied to the Cu-In-O target was rectilinearly changed form 50 W to 1 KW. An oxide thin film precursor thus obtained was placed in a silica tube and heat treated for 1 hr. at a temperature of 550° C. in an atmosphere containing 2 vol % of $H_2Se$ diluted with Ar at a vacuum of 500 Torr. Thus, a semiconductor thin film having a chalcopyrite structure which comprises Groups IB, IIIA, and VIA elements, i.e., a Cu(In, Ga) $Se_2$ thin film, was obtained.

Figure 10:
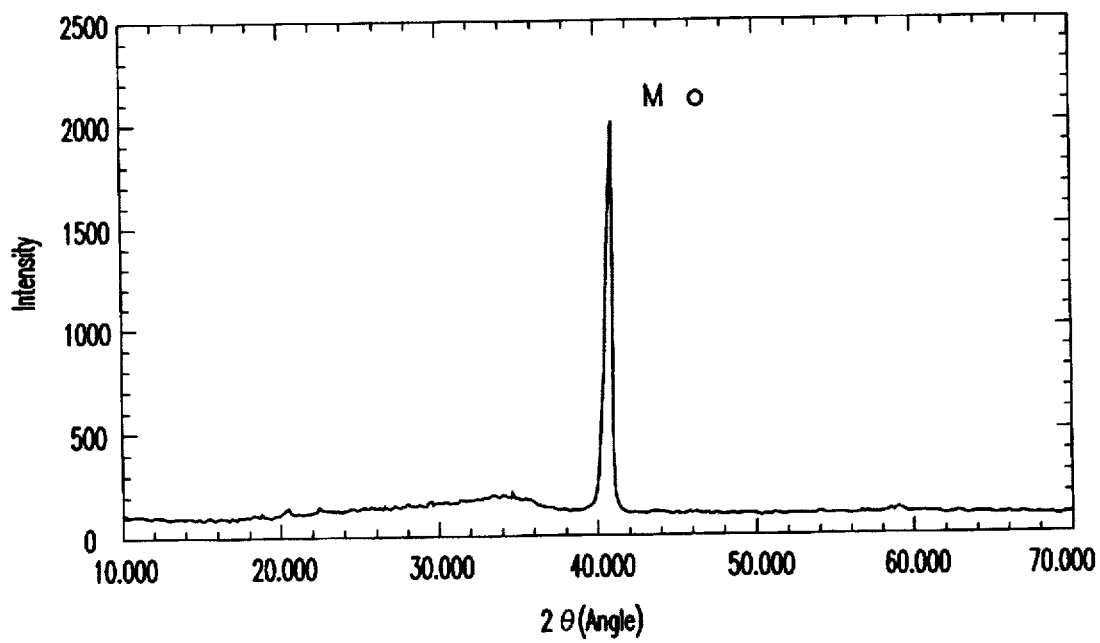
FIG. 10 is a chart showing the X-ray diffraction pattern of the oxide precursor obtained according to an embodiment of the present invention.
Figure 11:
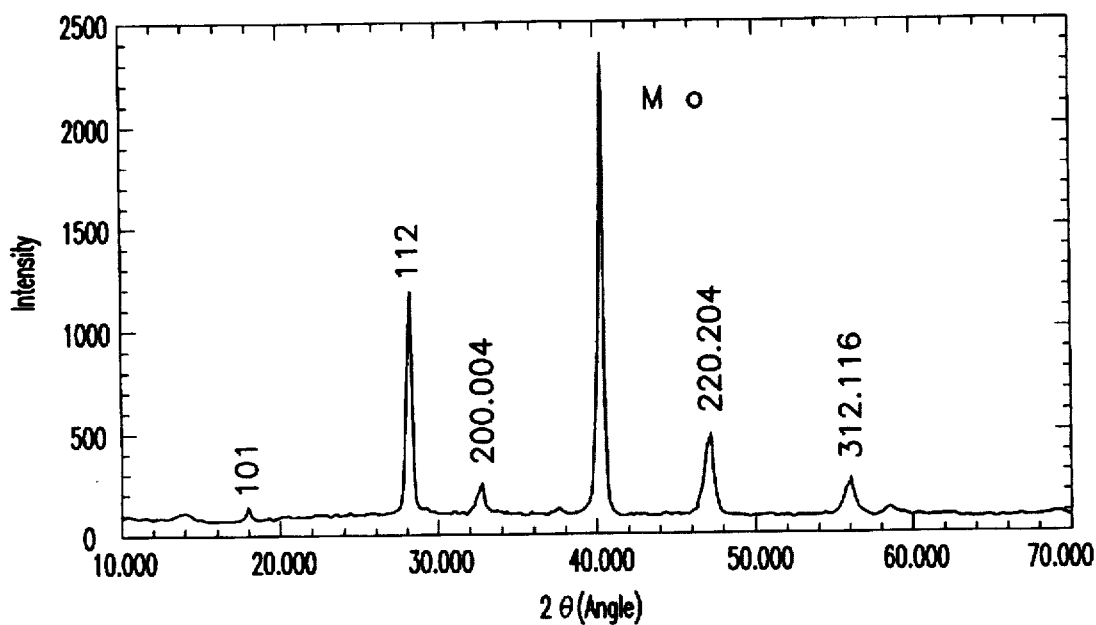
FIG. 11 is a chart showing the X-ray diffraction pattern of a $Cu(In,Ga)Se_2$ obtained according to an embodiment of the present invention.

FIGS. 10 and 11 show the X-ray diffraction patterns of the oxide thin film and the Cu(In, Ga) $Se_2$ thin film, respectively. In FIG. 10, it is apparent that a diffraction peak is not observed and the oxide thin film is in the amorphous state. In FIG. 11, it is apparent that a 101 peak peculiar to the chalcopyrite structure is observed and a semiconductor thin film having the chalcopyrite structure has been produced. In the case where the Cu(In, Ga) $Se_2$ film is a mixture of $CuInSe_2$ and $CuGaSe_2$, peak separation is usually observed. However, it is confirmed that a Cu(In, Ga)$Se_2$ film in which In forms a sold solution with Ga has been formed because a 112 peak and the like are observed without separation.

Figure 12:
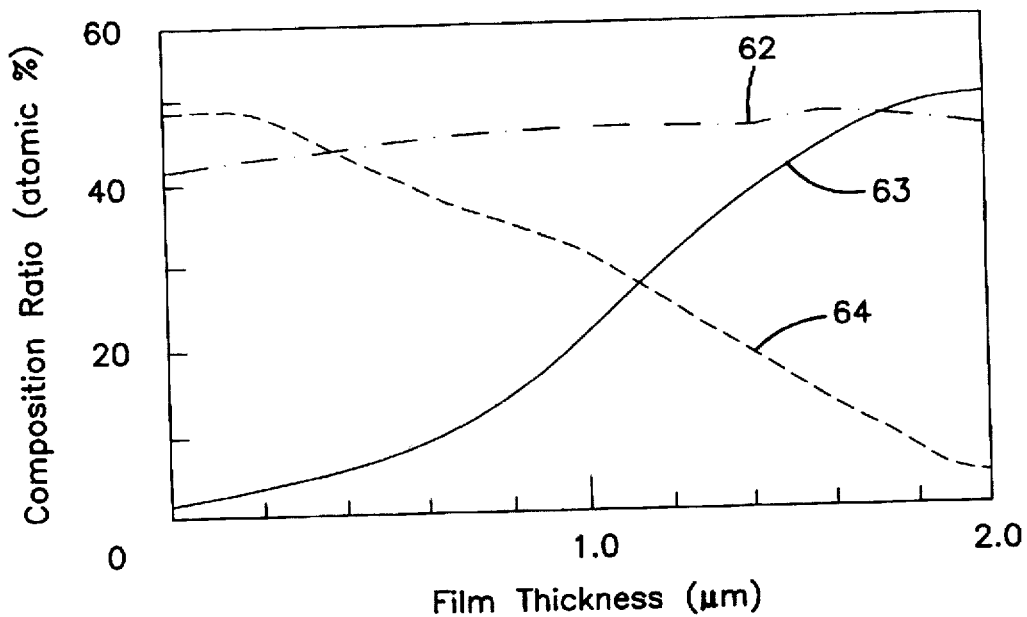
FIG. 12 is a graph showing the composition variation in the thickness direction of an oxide precursor film obtained according to an embodiment of the present invention.
Figure 13:
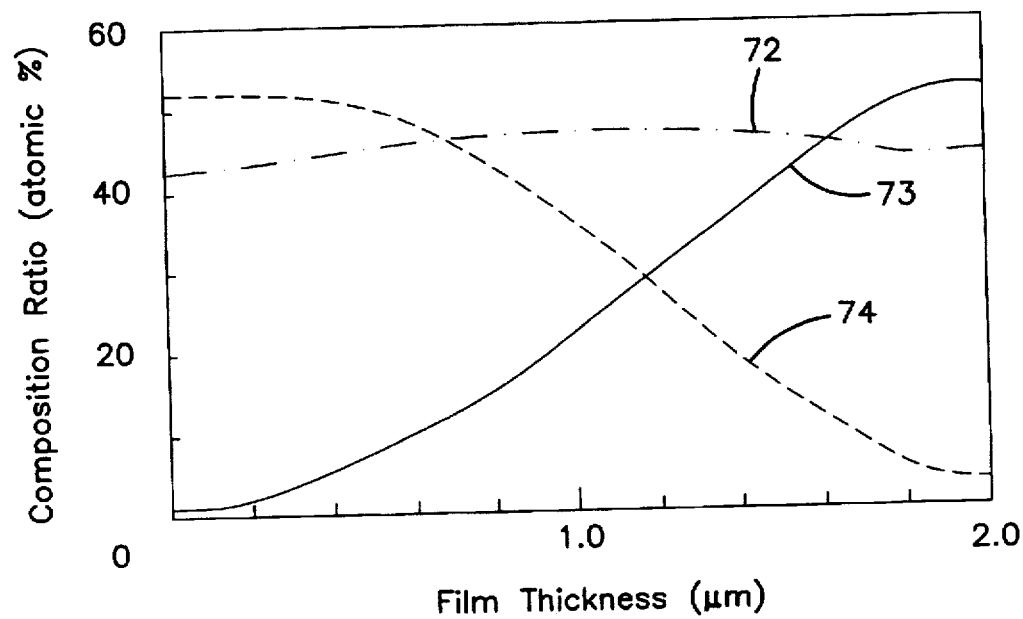
FIG. 13 is a graph showing the composition variation in the direction of the thickness of the $Cu(In,Ga)Se_2$ film obtained according to an embodiment of the present invention.

FIGS. 12 and 13 show the results obtained by measuring the element variations of the Cu-In-Ga-O thin film and the Cu(In, Ga) $Se_2$ thin film in the direction of film thickness by Auger electron spectroscopy. The abscissa indicates film thickness, wherein 0 thickness represents the surface of the film. Curves 62 and 72 indicate the variation of Cu. Curves 63 and 73 indicate the variation of Ga. Curves 64 and 74 indicate the variation of in. As is apparent from FIG. 12, Cu of the oxide thin film Cu-In-Ga-O is contained almost uniformly in the direction of film thickness, and the amounts of In and Ga are respectively rectilinearly decreased and increased from the film surface to the Mo film side of the substrate. Accordingly, it is seen that the mixing ratios of In and Ga in the film can be controlled by the power applied to the target.

As is apparent form FIG. 13, Cu of the Cu(In, Ga)$Se_2$ thin film is uniformly contained in the direction of film thickness, and In and Ga of the Cu(In, Ga)$Se_2$ thin film are respectively decreased and increased from the film surface to the Mo film side similarly to the oxide precursor thin film. Accordingly, it is apparent that the Cu(in, Ga)$Se_2$ film maintains the composition of the oxide thin film.

A CdS film (n type semiconductor film) was deposited on the Cu(In, Ga)$Se_2$ film (p type semiconductor film) by the solution deposition method using cadmium chloride and thiourea in which aqueous ammonia having a concentration of 1.5 wt % acts as a solvent. Zno insulating film and an ITO film (an $In_2O_3.SnO$ film having a SnO content of 5 wt %) as transparent electrode were further deposited by the sputtering method. Thus, a solar cell was produced. Light of AM1.5, 100 mW/cm² was irradiated on the solar cell to measure current-voltage characteristics. As a result, a conversion efficiency of 12% or more was obtained. This value is higher than that of a solar cell using a $Cu(In_{0.6}Ga_{0.4})Se_2$ thin film which has uniform composition (a conversion efficiency of about 10%).

Figure 14:
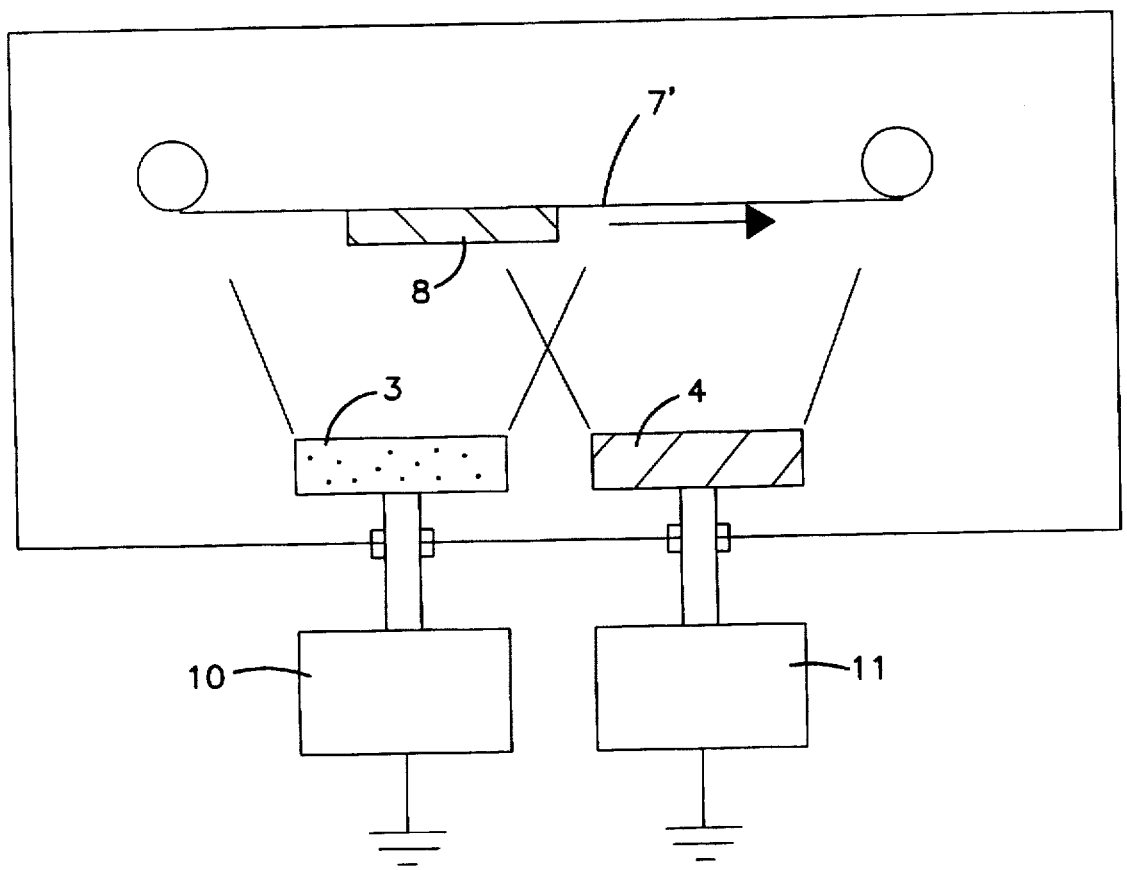
FIG. 14 is a schematic sectional view showing another sputtering device used for the manufacture of an oxide precursor film according to an embodiment of the present invention.

Also in the case of using a sputtering device shown in FIG. 14, it is possible to manufacture a precursor in which the concentrations of In and Ga are changed in the direction of a film thickness, similarly to the present example. In this case, the power applied to the Cu-Ga-O and Cu-In-O targets 3 and 4 is constant and a substrate holding plate 7' can be moved in the direction shown by the arrow. Consequently, sputtering is performed while moving the substrate 8 so that the composition ratios of Ga and In are changed in the direction of film thickness. More specifically, if the substrate 8 is in the vicinity of the Cu-Ga-O target 2, the Ga content is large. The In content is increased as the substrate 8 is moved above the Cu-In-O target 4. By using this method, oxide thin film precursors can be formed one after another on a large-area substrate. Thus, the mass production of the solar cell can be realized and costs can be reduced.

EXAMPLE 9

Figure 15:
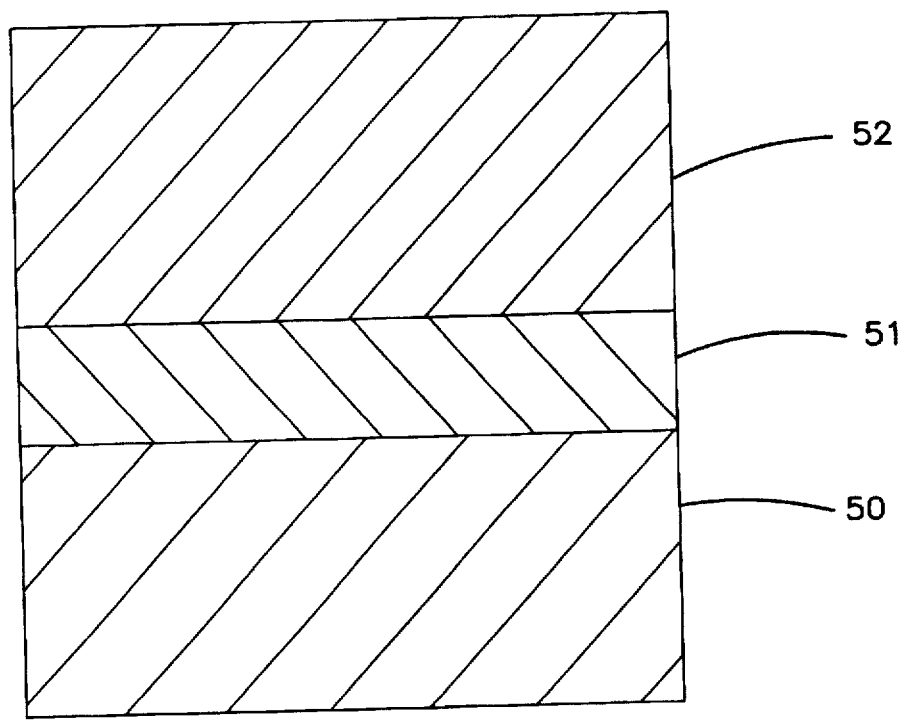
FIG. 15 is a sectional view showing the structure of an oxide precursor film obtained according to another embodiment of the present invention.

FIG. 15 is a sectional view showing the structure of a precursor formed of an oxide thin film according to another embodiment of the present invention. Stainless steel coated with a Mo film was used as a substrate 50. Mo was employed because it is preferably used as an ohmic electrode when producing a solar cell as described above. Stainless steel is used as a packaging material when finishing the solar cell into a package, and serves as the substrate material and the package material.

A $Cu-In_{0.8}-Ga_{0.2}-O$ film 51 was first formed in a thickness of about 0.2 μm on the substrate 50. Then, a Cu-In-O film 52 was deposited in a thickness of 0.8 μm on the $Cu-In_{0.8}-Ga_{0.2}-O$ film 51. In order to form a precursor, a sputtering device as shown in FIG. 4 was used. Sintered bodies of $Cu-In_{0.8}-Ga_{0.2}-O$ and Cu-In-O were used for targets 3 and 4. 1 KW of power was applied to the target and only shutter 5 was opened for about 10 minutes to deposit the $Cu-In_{0.8}-Ga_{0.2}-O$ film on a substrate 50 until the above film thickness was obtained in an Ar and $O_2$ atmosphere similar to Example 8. Then, the shutter 5 was closed and shutter 6 was opened for about 40 minutes to deposit the Cu-In-O film until the above film thickness was obtained. The precursor thus produced was placed in a silica tube and heat treated for 1 hr. at a temperature of 550° C. in a $H_2S$ and $H_2$ atmosphere at a vacuum of about 100 Torr (volumeric ratio $H_2S:H_2=$ 1:3). Thus, a Cu(In, Ga)$S_2$ film was produced. For comparison, two other precursors in which only Cu-In-O was deposited and only $Cu-In_{0.8}-Ga_{0.2}-O$ was deposited in thicknesses of about 1.0 μm on the stainless steel coated with Mo were sulfurized under the same conditions. Thus, a $CuInS_2$ film and a $Cu(In_{0.8}Ga_{0.2})S_2$ film were respectively produced.

Next performed are steps of depositing a window layer, a transparent electrode film, and the like on the photoabsorptive layer in order to form a solar cell. It is preferred that a photoabsorptive layer which does not peel off the substrate even though these steps are conducted is produced. In order to check adhesion, the obtained film is immersed in pure water and ultrasonic cleaning was performed for about 5 minutes. As a result, the $CuInS_2$ film was almost peeled off from the Mo but the Cu(In, Ga)$S_2$ film and the $Cu(In_{0.8}Ga_{0.2})S_2$ film was not peeled off from the Mo. Accordingly, it is apparent that the $CuInS_2$ film to which Ga is added is more preferable for producing the solar cell.

A CdS film was deposited on the obtained Cu(In, Ga)$S_2$ film and the $Cu(In_{0.8}Ga_{0.2})S_2$ film by the solution deposition method described above. Furthermore, a ZnO film which is a transparent insulating film and ITO film which is a transparent conductive film were deposited by the sputtering method. Thus, a solar cell was produced. Am1.5, 100 mW/cm² of light was irradiated on the solar cell to measure current-voltage characteristics. As a result, the solar cell using, as the photoabsorptive film, the Cu(In, Ga)S$_2$ film having different compositions of In and Ga in the direction of film thickness had a conversion efficiency of 12% or more. On the other hand, the Cu(In$_{0.8}$Ga$_{0.2}$)S$_2$ film having a uniform composition in the direction of the film thickness had a conversion efficiency of 10%. The Cu(In, Ga)S$_2$ film having a layer whose band gap is larger in the vicinity of the Mo film as a back electrode has less photocarrier recombination through the back electrode. Consequently, a greater photocurrent can be generated.

Similarly to Example 8, the same precursor as in the present example can be produced by a device shown in FIG. 14. In this case, the movement of the substrate is topped above the Cu-In$_{0.8}$-Ga$_{0.2}$-O target 3 and sputter deposition is performed for a predetermined time until a desired film thickness is obtained. Then, the substrate is moved above the Cu-In-O target 4 and the sputter deposition is performed for a predetermined time until a desired thickness is obtained. Thus, the precursor can be formed easily.

While stainless steel was used as the substrate in the present example, the same results can be obtained also in the case where a metal substrate such as a Mo sheet or an Al sheet is used.

EXAMPLE 10

A method for manufacturing a semiconductor thin film comprising Groups IB, IIIA, and VIA elements in which a different oxide thin film from those of the above examples is used for a precursor will be described below. In FIG. 15, a substrate 50 formed by coating alumina with a Pt film was used. A Cu-Ga-O film 51 was formed in a thickness of about 0.05 μm on the substrate and then a Cu-In-O film 52 was formed in a thickness of about 1.0 μm on the Cu-Ga-O film 51. In order to form a precursor, the device shown in FIG. 4 was used similarly to Example 9. 0.5 KW and 1 KW of power were applied to the targets and only shutter 5 was opened for about 10 minutes to deposit a Cu-Ga-O film on the substrate 50 until the above film thickness was obtained in an Ar and O$_2$ atmosphere, similar to Example 8. Then, the shutter 5 was closed and shutter 6 was opened for about 50 minutes to deposit a Cu-In-O film until the above film thickness was obtained. For comparison, a precursor in which only the Cu-In-O film was deposited in a thickness of about 1.0 μm on the same substrate was produced.

The precursors having two-layer and one-layer structures thus produced were placed in a silica tube and heat treated for 1 hr. at a temperature of 550° C. in a gas mixture atmosphere comprising H$_2$S, Ar, and H$_2$ (volumeric ratio H$_2$S:Ar:H$_2$=1:10:3) at a vacuum of about 500 Torr. Thus, a Cu(In, Ga)S$_2$ film having a two-layer structure and a CuInS$_2$ film having a one-layer structure were produced.

The film thus obtained was immersed in pure water and ultrasonic cleaning was performed for 5 minutes. The CuInS$_2$ film was almost peeled off from a Pt film but the Cu(In, Ga)S$_2$ film was not peeled off from the Pt film. It is apparent that a Cu-Ga-O film having a thickness of about 0.05 μm is deposited on a metal electrode so that adhesion is increased.

A CdS film was deposited on the obtained Cu(In, Ga)S$_2$ film by the solution deposition method described above. Furthermore, a ZnO film, which is a transparent insulating film, and an ITO film, which is transparent conductive film, were deposited by the sputtering method. Thus, a solar cell was produced. Am1.5, 100 mW/cm² of light was irradiated on the solar cell to measure current-voltage characteristics. As a result, the Cu(In, Ga)S$_2$ film solar cell having a two-layer structure had a conversion efficiency of 11% or more, which is a little inferior to that of the Cu(In, Ga)S$_2$ film solar cell of Example 9. The reason is as follows. The CuInS$_2$ film grows on the CuGaS$_2$ film having a greatly different lattice constant, so that the crystalline properties are inferior to those of the film of Example 9 and the capture center of photocarriers is increased. The present example is inferior to Example 9 in conversion efficiency. However, since the oxide target having a simple composition is used, a difference of composition between the target and the obtained oxide film is not caused by sputtering and an oxide film having the desired composition can be deposited. Consequently, the reproducibility of performance is excellent.

EXAMPLE 11

In this example the present invention is applied to a superstrate type solar cell wherein light is incident on the light transmitting substrate side such as a glass.

Figure 16:
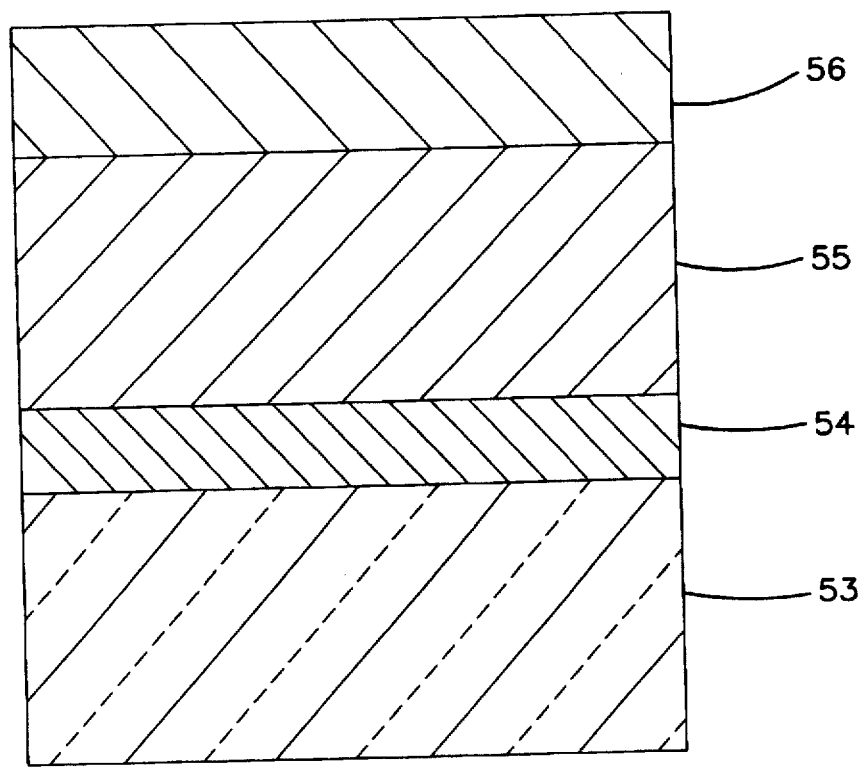
FIG. 16 is a sectional view showing the structure of an oxide precursor film obtained according to still another embodiment of the present invention.

FIG. 16 shows the structure of a precursor formed of an oxide thin film according to the present example. A ZnO insulating film and a conductive film ZnO.Al$_2$O$_3$ (Al$_2$O$_3$ content of 2 wt %) were sequentially deposited on a glass to form a substrate 53. A Cu-(In$_{0.6}$-Ga$_{0.4}$)-O film 54 was first deposited on the substrate 53. A Cu-(In$_{0.8}$-Ga$_{0.2}$)-O film 55 was deposited on the Cu-(In$_{0.6}$-Ga$_{0.4}$) film 54. Finally, a Cu-(In$_{0.7}$-Ga$_{0.3}$)-O film 56 was deposited. The thicknesses of the oxide films 54, 55, and 56 are 0.1, 0.6, and 0.3 μm. In order to produce a precursor, a device formed by adding to the device shown in FIG. 4 a target, a high voltage supply, and a shutter as another sputtering supply was used. Cu-In$_{0.6}$-Ga$_{0.4}$-O, Cu-In$_{0.8}$-Ga$_{0.2}$-O, Cu-In$_{0.7}$-Ga$_{0.3}$-O were used for targets. 0.5 KW, 1 KW, and 1 KW of high frequency power were applied to the respective targets so that sputtering was performed in the same atmosphere as in Example 8. The shutter was opened and closed so as to obtain the above film thicknesses. The oxide thin film precursor thus produced was placed in a silica tube, and heat treated for 1 hr. at a temperature of 550° C. in an atmosphere containing 2 vol % of H$_2$Se diluted with Ar and H$_2$ at a vacuum of 500 Torr (volumeric ratio Ar+H$_2$Se:H$_2$=10:1). Thus, a Cu(In, Ga)Se$_2$ thin film having a different composition ratio of In and Ga in the thickness direction was formed.

Figure 17:
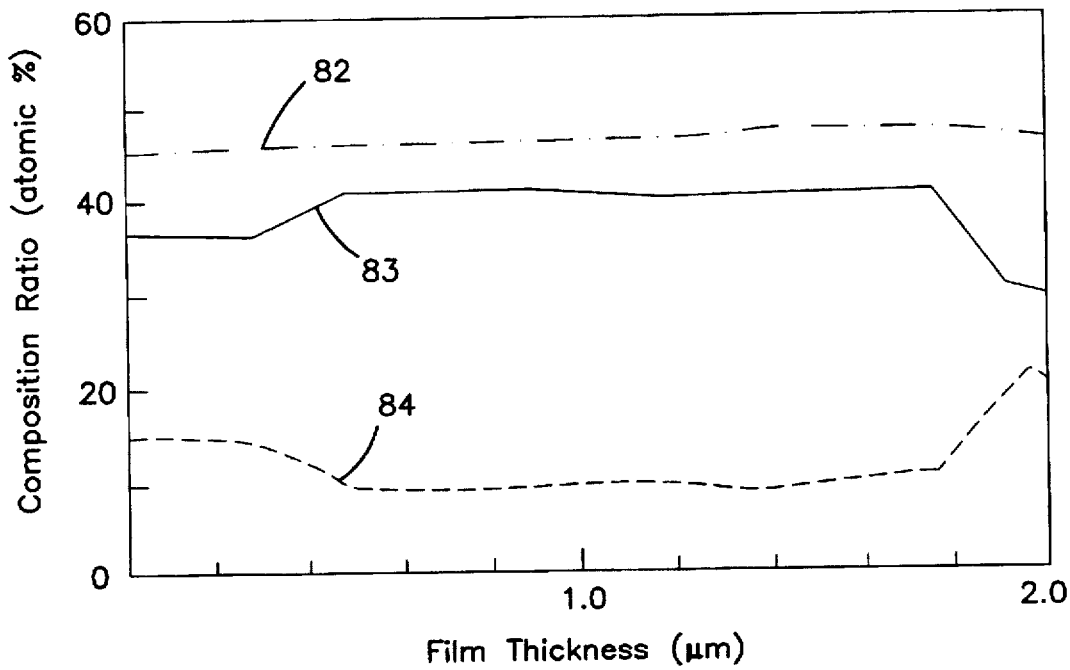
FIG. 17 is a graph showing the composition variation in the thickness direction of an oxide precursor film according to an embodiment of the present invention.
Figure 18:
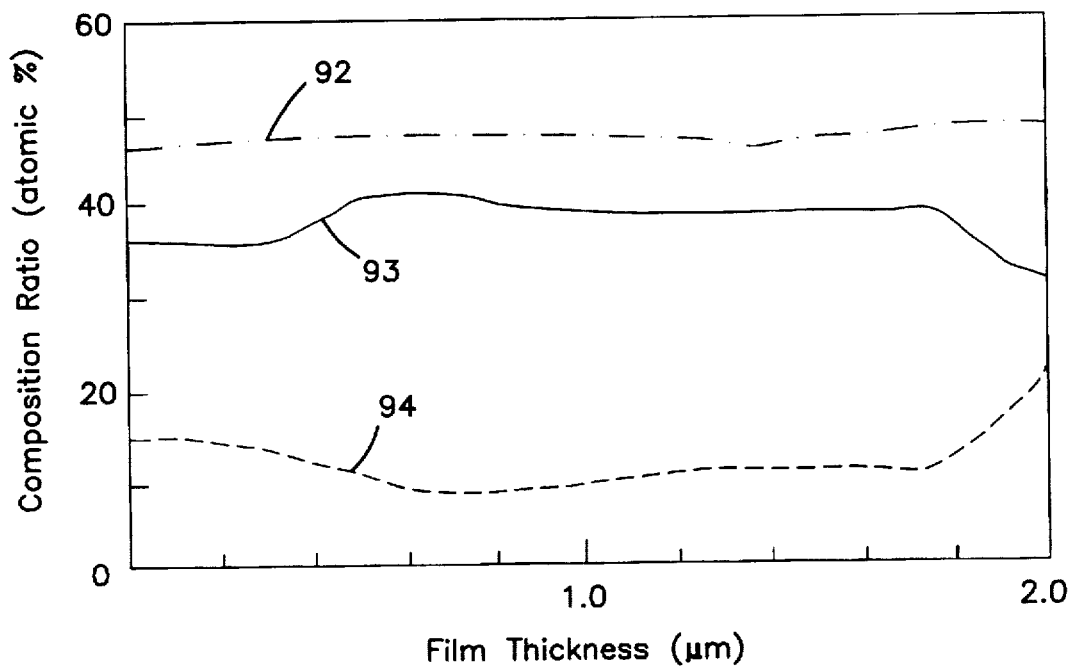
FIG. 18 is a graph showing the composition variation in the thickness direction of a $Cu(in,Ga)Se_2$ film obtained according to an embodiment of the present invention.

FIGS. 17 and 18 show the composition variation of the precursor and the selenized Cu(In, Ga)Se$_2$ film in the thickness direction obtained by Auger electronic spectroscopy. In FIGS. 17 and 18, curves 82 and 92 indicate the composition ratio of Cu, curves 83 and 93 indicate the composition ratios of In, and curves 84 and 94 indicate the composition ratio of Ga. It is apparent that the Cu(In, Ga)Se$_2$ film maintains the variation of Cu, In, and Ga of the oxide precursor. Accordingly, it is seen that the composition of a semiconductor thin film having a chalcopyrite structure that is produced by selenization or sulfurization can be controlled by the composition variation of the oxide precursor. Consequently, it is possible to design the variation of the band gap of a solar cell having a higher conversion efficiency. For example, when the Ga content is increased, the band gap of the Cu(In, Ga)Se$_2$ becomes larger. Accordingly, if a layer having the high Ga content is provided at the interface with a window layer ZnO, an increase in open circuit voltage that is dependent on the forbidden band gap of the pn junction can be expected.

An Au film was deposited as a back electrode in a thickness of about 0.15 μm on the Cu(In, Ga)Se$_2$ film so that a solar cell was produced. Am1.5, 100 mW/cm$^2$ was irradiated on the solar cell to measure current-voltage characteristics. As a result, the solar cell thus obtained had a conversion ratio of 11% or more, which is higher than the conversion efficiency, i.e. about 8%, of a superstrate type Cu(In, Ga)Se$_2$ solar cell produced by depositing each component element by the vapor deposition method.

The precursor of the present invention can be manufactured by using the device shown in FIG. 14. In this case, if a target as a sputtering source and a high voltage supply for applying power to the target are added, the precursor can be manufactured by the same procedure as in Example 9.

While ZnO.Al$_2$O$_3$ and ZnO have been used as the transparent conductive film and the transparent insulating film in the present invention, the same results can be obtained also when SnO$_2$ or ITO, and Al$_2$O$_3$ or TiO$_2$ are respectively used as the transparent conductive and insulating films.

The precursor for a semiconductor thin film according to the present example is used to produce a semiconductor thin film having a chalcopyrite structure comprising Groups IB, IIIA, and VIA elements. By using the semiconductor thin film for the photoabsorptive layer of the solar cell, a solar cell having a high and almost uniform conversion efficiency over a large area can be obtained.

The present invention can provide a precursor for a semiconductor thin film and a method for manufacturing the semiconductor thin film suitable for a solar cell having a high conversion efficiency and excellent productivity.

The invention may be embodied in other forms without departing from the spirit or essential characteristics thereof. The embodiments disclosed in this application are to be considered in all respects as illustrative and not restrictive, the scope of the invention is indicated by appended claims rather than by the foregoing description, and all changes which come within the meaning and range of equivalency of the claims are intended to be embraced therein.

What is claimed is:

1. A precursor for manufacturing a semiconductor thin film, comprising an oxide thin film comprising at least one element as a dopant selected from a group which consists of Groups IA, IIA, IIB, VA, and VB elements, and Groups IB and IIIA elements as main components of said semiconductor film, deposited on a substrate.

2. The precursor for manufacturing a semiconductor thin film as defined in claim 1, wherein the oxide thin film comprising the dopant and Groups IB and IIIA elements deposited on the substrate has a composition ratio with respect to the dopant which is not constant from the substrate to the film surface in the direction of film thickness.

3. A precursor for manufacturing a semiconductor thin film, comprising at least two oxide thin films each comprising an element as a dopant chosen from a group which consists of Groups IA, IIA, IIB, VA, and VB elements, and Groups IB and IIIA elements as main components of said semiconductor film, deposited on a substrate, the composition ratios with respect to the dopant element being different in said at least two thin films.

4. A precursor for manufacturing a semiconductor thin film, comprising at least one oxide thin film comprising Groups IB and IIIA elements and at least one oxide thin film comprising an element as a dopant chosen from a group which consists of Groups IA, IIA, IIB, VA, and VB elements alternately deposited on a substrate.

5. The precursor for manufacturing a semiconductor thin film as defined in claim 4, wherein an oxide thin film comprising said dopant element is first deposited on the substrate and an oxide thin film comprising Groups IB and IIIA elements is then deposited.

6. The precursor for manufacturing a semiconductor thin film as defined in claim 4, wherein an oxide thin film comprising Groups IB and IIIA elements is first deposited on the substrate and an oxide thin film comprising said dopant element is then deposited.

7. The precursor for manufacturing a semiconductor thin film as defined in claim 4, wherein an oxide thin film comprising a first said element as a dopant, an oxide thin film comprising Group IB and IIIA elements, and an oxide thin film comprising a second said element as a dopant are sequentially deposited on said substrate.

8. The precursor for manufacturing a semiconductor thin film as defined in claim 7, wherein the substrate is a metal or a metal film, the first said element which acts as a dopant is at least one element selected from the group which consists of Groups IA, VA, and VB elements, and the second said element which acts as a dopant is at least one element selected from the group which consists of Groups IIA and IIB elements.

9. The precursor for manufacturing a semiconductor thin film as defined in claim 7, wherein the substrate is a transparent conductive film or a two-layered film comprising a transparent conductive film and a transparent insulating film, the first said element which acts as a dopant is at least one element selected from the group which consists of Groups IIA and IIB elements, and the second said element which acts as a dopant is at least one element selected from the group which consists of Groups IA, VA, and VB elements.

10. A precursor for manufacturing a semiconductor thin film, comprising an oxide thin film comprising Groups IB and IIIA elements deposited on a substrate, wherein the composition of at least one of said Groups IB and IIIA elements is varied in the direction of film thickness.

11. The precursor for manufacturing a semiconductor thin film as defined in claim 10, wherein the oxide thin film comprising the Groups IB and IIIA elements deposited on the substrate contains a Group IB element and at least two kinds of Group IIIA elements, and the composition ratio of the Group IIIA elements is continuously varied from the substrate to the surface of the oxide thin film in the direction of film thickness.

12. The precursor for manufacturing a semiconductor thin film as defined in claim 10, wherein the oxide thin film comprising the Groups IB and IIIA elements comprises two or more layers which contain a Group IB element and at least one Group IIIA element, respectively, and the oxide thin film having two or more layers has different composition ratios of a specific Group IIIA element.

13. The precursor for manufacturing a semiconductor thin film as defined in claim 10, wherein the oxide thin film comprising Groups IB and IIIA elements comprises two or more layers in which the specific Group IIIA element is varied.

14. The precursor for manufacturing a semiconductor thin film as defined in claim 10, wherein the Group IIIA element of the oxide thin film comprising the Groups IB and IIIA elements in contact with the substrate includes at least Ga.

15. The precursor for manufacturing a semiconductor thin film as defined in claim 10, wherein the substrate is a metal substrate or an insulating substrate coated with a metal thin film.

16. The precursor for manufacturing a semiconductor thin film as defined in claim 10, wherein the substrate is a transparent insulating substrate coated with a transparent conductive film or a transparent insulating substrate coated with a transparent insulating film and a transparent conductive film.

17. A method for manufacturing a semiconductor thin film, comprising heat treating in an atmosphere containing a Group VIA element a precursor for manufacturing a semiconductor thin film, the precursor comprising an oxide thin film comprising at least one element as a dopant selected from a group which consists of Groups IA, IIA, IIB, VA, and VB elements, and Groups IB and IIIA elements as main components of said semiconductor film, deposited on a substrate.

18. The method for manufacturing a semiconductor thin film as defined in claim 17, wherein the atmosphere containing the Group VIA element comprises at least one compound selected from a group which consists of a hydride gas of the Group VIA element, a carbon compound of the Group VIA element, and an organic compound of the Group VIA element.

19. The method for manufacturing a semiconductor thin film as defined in claim 17, wherein the heat treatment is performed in an atmosphere further containing at least one of hydrogen and carbon monoxide.

20. The method for manufacturing a semiconductor thin film as defined in claim 17, wherein the heat treatment is performed at a temperature of 200° to 1000° C.

21. The method for manufacturing a semiconductor thin film as defined in claim 17, wherein the semiconductor thin film is used as an absorber of a solar cell.

22. The method of claim 17, wherein the oxide thin film comprising the dopant and Groups IB and IIIA elements deposited on the substrate has a composition ratio with respect to the dopant which is not constant from the substrate to the film surface in the direction of film thickness.

23. A method for manufacturing a semiconductor thin film, comprising the step of heat treating in an atmosphere containing a Group VIA element a precursor for manufacturing a semiconductor thin film, the precursor comprising at least two oxide thin films, each comprising an element as a dopant selected from a group which consist of Groups IA, IIA, IIB, VA, and VB elements, and Groups IB and IIIA elements as main components of said semiconductor film, deposited on a substrate, the composition ratios with respect to the dopant element being different in said at least two thin films.

24. A method for manufacturing a semiconductor thin film, comprising the step of heat treating in an atmosphere containing a Group VIA element a precursor for manufacturing a semiconductor thin film, the precursor comprising at least one oxide thin film comprising Groups IB and IIIA elements and at least one oxide thin film comprising an element as a dopant chosen from a group which consists of Groups IA, IIA, IIB, VA, and VB elements alternately deposited on a substrate.

25. The method according to claim 24, wherein an oxide thin film comprising said dopant element is first deposited on the substrate and an oxide thin film comprising Groups IB and IIIA elements is then deposited.

26. The method according to claim 24, wherein an oxide thin film comprising Groups IB and IIIA elements is first deposited on the substrate and an oxide thin film comprising said dopant element is then deposited.

27. The method according to claim 24, wherein an oxide thin film comprising a first said element as a dopant, an oxide thin film comprising Groups IB and IIIA elements, and an oxide thin film comprising a second said element as a dopant are sequentially deposited on said substrate.

28. The method according to claim 27, wherein the substrate is a metal or a metal film, the first said element which acts as a dopant is at least one element selected from the group which consists of Groups IA, VA, and VB elements, and the second said element which acts as a dopant is at least one element selected from the group which consists of Groups IIA and IIB elements.

29. The method according to claim 27, wherein the substrate is a transparent conductive film or a two-layered film comprising a transparent conductive film and a transparent insulating film, the first said element which acts as a dopant is at least one element selected from the group which consists of Groups IIA and IIB elements, and the second said element which acts as a dopant is at least one element selected from the group which consists of Groups IA, VA, and VB elements.

30. A method for manufacturing a semiconductor thin film, comprising the step of heating a precursor for manufacturing a semiconductor thin film in an atmosphere containing a Group VIA element so that a semiconductor thin film having a chalcopyrite structure which comprises Group IB, IIIA, and VIA elements is formed, the precursor comprising an oxide thin film comprising Groups IB and IIIA elements deposited on the substrate, wherein the composition of at least one of said Groups IB and IIIA elements is varied in the direction of film thickness.

31. The method for manufacturing a semiconductor thin film as defined in claim 30, wherein the heat treatment is performed in an atmosphere further containing at least one of hydrogen and carbon monoxide.

32. The method for manufacturing a semiconductor thin film as defined in claim 30, wherein the heat treatment is performed at a temperature of 200° to 1000° C.

33. The method for manufacturing a semiconductor thin film as defined in claim 30, wherein the semiconductor thin film is used as an absorber of a solar cell.

34. The method according to claim 30, wherein the oxide thin film comprising the Groups IB and IIIA elements deposited on the substrate contains a Group IB element and at least two kinds of Group IIIA elements, and the composition ratio of the Group IIIA element is continuously varied from the substrate to the surface of the oxide thin film in the direction of film thickness.

35. The method according to claim 30, wherein the oxide thin film comprising the Groups IB and IIIA elements comprises two or more layers which contain a Group IB element and at least one Group IIIA element, respectively, and the oxide thin film having two or more layers has different composition ratios of a specific group IIIA element.

36. The method according to claim 30, wherein the oxide thin comprising the Groups IB and IIIA elements comprises two or more layers in which the specific Group IIIA element is varied.

37. The method according to claim 30, wherein the Group IIIA element of the oxide thin film comprising the Groups IB and IIIA elements in contact with the substrate includes at least Ga.

38. The method according to claim 30, wherein the substrate is a metal substrate or an insulating substrate coated with a metal thin film.

39. The method according to claim 30, wherein the substrate is a transparent insulating substrate coated with a transparent conductive film or a transparent insulating substrate coated with a transparent insulating film and a transparent conductive film.

* * * * *